(12) United States Patent
Ahiko et al.

(10) Patent No.: US 6,576,497 B2
(45) Date of Patent: Jun. 10, 2003

(54) CHIP-TYPE ELECTRONIC COMPONENT

(75) Inventors: Taisuke Ahiko, Chuo-ku (JP); Takaya Ishigaki, Chuo-ku (JP); Hiroki Sato, Chuo-ku (JP); Kamiya Takashi, Chuo-ku (JP); Masanori Yamamoto, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/014,856

(22) Filed: Dec. 14, 2001

(65) Prior Publication Data

US 2002/0070442 A1 Jun. 13, 2002

Related U.S. Application Data

(62) Division of application No. 09/282,415, filed on Mar. 31, 1999, now Pat. No. 6,380,619.

(30) Foreign Application Priority Data

Mar. 31, 1998 (JP) .......................... 10-104075
Apr. 21, 1998 (JP) .......................... 10-111044
Oct. 29, 1998 (JP) .......................... 10-307593

(51) Int. Cl.[7] .................. H01L 21/44; H01L 21/48; H01L 21/50; H01L 21/20; H01L 23/12
(52) U.S. Cl. .................. 438/122; 438/125; 438/399; 257/700; 257/703; 257/717
(58) Field of Search .................. 438/125, 122, 438/399; 257/700, 703, 717

(56) References Cited

U.S. PATENT DOCUMENTS 3,444,436 A    5/1969   Coda
3,612,963 A *  10/1971  Piper et al. .................. 317/261
5,302,880 A *  4/1994   Kaida .......................... 310/370
5,590,016 A    12/1996  Fujishiro et al.
5,805,409 A    9/1998   Takahara et al.
5,935,365 A    8/1999   Kobayashi et al.
6,011,683 A *  1/2000   Dat ........................... 361/306.1
6,104,599 A    8/2000   Ahiko et al.
6,191,933 B1   2/2001   Ishigaki et al.
6,310,759 B2   10/2001  Ishigaki et al.

FOREIGN PATENT DOCUMENTS

| JP | 63-14456 | 4/1988 |
|---|---|---|
| JP | 2-156514 | 6/1990 |
| JP | 5-55084 | 3/1993 |
| JP | 6-163311 | 6/1994 |
| JP | 7-201634 | 8/1995 |
| JP | 8-1875 | 1/1996 |
| JP | 8-181033 | 7/1996 |
| JP | 9-55333 | 2/1997 |
| JP | 9-260187 | 10/1997 |

* cited by examiner

Primary Examiner—Carl Whitehead, Jr.
Assistant Examiner—Nema Berezny
(74) Attorney, Agent, or Firm—Oblon, Spivak, McClelland, Maier & Neustadt, P.C.

(57) ABSTRACT

A ceramic substrate having two side surfaces in a lengthwise direction and two side surfaces in a widthwise direction intersecting each other. The ceramic substrate also includes at least one flat surface in a thicknesswise direction. Internal electrode films are embedded in the ceramic substrate with film surfaces thereof extending roughly parallel to the flat surface of the ceramic substrate. External electrodes are each provided on the flat surface of the ceramic substrate toward one of the two ends of the ceramic substrate in the lengthwise direction, are electrically continuous with the internal electrode films and are formed over distances and from the two side surfaces in the widthwise direction.

5 Claims, 28 Drawing Sheets

FIG. 30
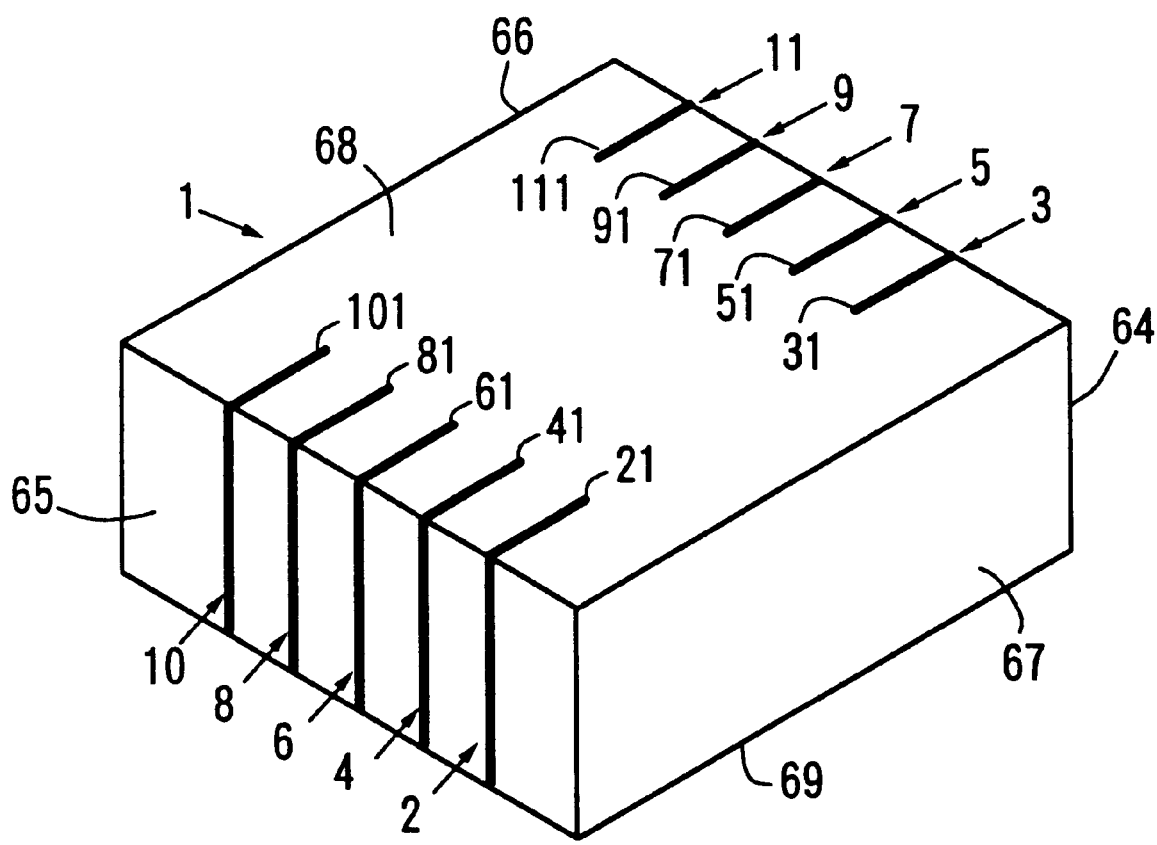
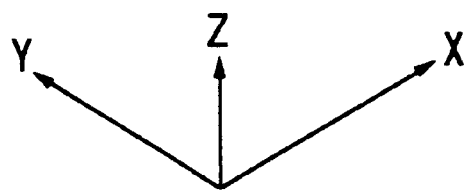

PRIOR ART

CHIP-TYPE ELECTRONIC COMPONENT

BACKGROUND OF THE INVENTION

1. Field of the Invention

The present invention relates to a chip-type electronic component to be surface mounted on a conductive pattern of a circuit board or the like.

2. Discussion of Background

The miniaturization of electronic devices accomplished in recent years has inspired efforts to achieve ever smaller chip-type electronic components. For instance, dimensions have been reduced to attain currently existing chip-type laminated ceramic capacitors having a length of 0.6 mm, a width of 0.3 mm and a thickness of 0.1 to 0.3 mm.

The component of the known art as described above includes a substrate having a roughly rectangular paralellepiped shape and two external electrodes to be soldered onto a conductive pattern of a circuit board or the like. Each external electrode is provided at one of two diametrical ends in the lengthwise direction of the substrate so as to cover one surface in its lengthwise direction, two surfaces in its widthwise direction and two surfaces in its thicknesswise direction.

When mounting the chip-type electronic component of the known art onto a conductive pattern of a circuit board or the like, it is necessary to allow for insulating gaps between the sides in its widthwise direction and sides of adjacent chip-type electronic components, or between sides in its widthwise direction and sides of adjacent circuit elements, since the electrodes that partially cover the sides may cause electrical shorting.

Also, when mounting the chip-type electronic component of the known art onto a conductive pattern of a circuit board or the like by means of soldering, an adverse phenomenon occurs. The weight of the component causes the molten solder to flow from under the external electrodes in a widthwise direction toward adjacent components provided on the circuit board. As a result, it is necessary to allow for insulating gaps between the sides in its widthwise direction and sides of adjacent chip-type electronic components, or between sides in its widthwise direction and sides of adjacent circuit elements, to ensure that the excess molten solder does not cause any electrical shorting.

Thus, while super miniaturization of chip-type electronic components has been successful, the extent to which mounting density can be improved is still limited.

As a means for solving this problem, Japanese Unexamined Patent Publication No. 201634/1995 discloses a component that includes a substrate having a roughly rectangular paralellepiped shape and two external electrodes to be soldered onto a conductive pattern of a circuit board or the like. Each external electrode is provided at one of two diametrical ends in the lengthwise direction of the substrate so as to cover only the two surfaces in its thicknesswise direction.

As another means for improving the mounting density, Japanese Unexamined Patent Publication No. 156514/1990 discloses a component that includes a substrate having a roughly rectangular paralellepiped shape and two external electrodes to be soldered onto a conductive pattern of a circuit board or the like. Each external electrode is provided at one of two diametrical ends in the lengthwise direction of the substrate so as to cover only one of the two surfaces in the thicknesswise direction of the substrate.

However, since the external electrodes in both of these prior art components are formed over their entire width, the phenomenon whereby the molten solder flows from under the external electrodes in a widthwise direction toward adjacent components provided on the circuit board, cannot be prevented.

Still as another means for improving the mounting density, Japanese Unexamined Patent Publication No. 55333/1997 discloses a component that includes a substrate having a roughly rectangular paralellepiped shape and two external electrodes to be soldered onto a conductive pattern of a circuit board or the like. Each external electrode is provided at one of two diametrical ends in the lengthwise direction of the substrate so as to cover two surfaces in its widthwise direction and two surfaces in its thicknesswise direction. Since the external electrodes are provided at diametrical ends in the lengthwise direction of the component, a similar problem to that of the electronic component disclosed in the aforementioned Japanese Unexamined Patent Publications occurs.

Furthermore, chip-type electronic components are usually surface mounted by means of reflow soldering. In this process, before mounting the external electrodes, a solder paste is applied to portions of the conductive pattern of a circuit board or the like where electrodes are to be mounted, after which the chip-type electronic component is set in place by ensuring that the external electrodes are positioned on the solder paste. Next, the solder paste is molten by way of applying heat after which the external electrodes of the chip-type electronic component become soldered to the conductive pattern on the circuit board or the like.

However, when the solder paste becomes molten during the reflow soldering process, its buoyancy and the like cause the chip-type electronic component to float on the circuit board which results in misalignment of the component.

With the appearance of ever smaller chip-type electronic components in recent years, floating and misalignment of minute chip-type electronic components has become common.

In order to prevent such floating and misalignment, the chip-type electronic components of the prior art must be held at a specific position until the molten solder becomes solidified, resulting in poor efficiency in the surface mounting process.

In addition, because the external electrodes of the chip-type electronic component in the prior art are provided at diametrical ends in the lengthwise direction of the substrate, a large solder fillet forms between the external electrodes and the conductive pattern when it is surface mounted on a circuit board or the like. These solder fillets may cause shorting between the chip-type electronic component and adjacent chip-type electronic components or between the chip-type electronic component and the conductive pattern of a circuit board or the like.

In order to prevent this problem from occurring, the mounting density at which chip-type electronic components are mounted must be reduced and, as a result, it presents an obstacle to achieve an improvement in the mounting density.

Yet as another means for improving the mounting density, Japanese Unexamined Patent Publication No. 55084/1993 discloses a laminated ceramic capacitor that includes a substrate having a roughly rectangular paralellepiped shape, internal electrodes and two external electrodes to be soldered onto a conductive pattern of a circuit board or the like. Portions of internal electrode films lead out to one surface in the thicknesswise direction of the substrate and external electrodes are provided where the portions of the internal electrodes are led out, to electrically connect the lead-out portions to the external electrodes. The ceramic substrate is achieved by alternately laminating internal electrode films and dielectric layers.

However, since the external electrodes in this prior art are flat, it is impossible to prevent floating and misalignment during the soldering process, resulting in shorting due to the presence of solder fillets.

SUMMARY OF THE INVENTION

It is an object of the present invention to provide a chip-type electronic component that achieves outstanding mass productivity.

It is a further object of the present invention to provide a chip-type electronic component that can be mounted onto a conductive pattern of a circuit board or the like by means of soldering.

It is a still further object of the present invention to provide a chip-type electronic component that can significantly improve the mounting density of a circuit board.

It is a still further object of the present invention to provide a chip-type electronic component that can be soldered with a high degree of reliability while reducing the likelihood of misalignment when it is surface mounted on a circuit board or the like.

In order to achieve the objects described above, the present invention discloses a chip-type electronic component in two modes. The chip-type electronic component in the first mode includes a ceramic substrate, at least one internal electrode film and a plurality of external electrodes. The ceramic substrate has two side surfaces in its lengthwise direction and two side surfaces in its widthwise direction intersecting each other, and is further provided with at least one flat surface in its thicknesswise direction.

The internal electrode film is embedded in the ceramic substrate. The surface of the internal electrode film lies roughly parallel to the flat surface of the ceramic substrate.

Each of the external electrodes is provided on the flat surface of the ceramic substrate at diametrical ends in the lengthwise direction of the ceramic substrate. They are each electrically continuous with the internal electrode film and are each formed over distances from the two side surfaces in the widthwise direction of the ceramic substrate.

As explained above, the two side surfaces in the lengthwise direction of the ceramic substrate and the two side surfaces in the widthwise direction of the ceramic substrate intersect. In other words, the ceramic substrate is formed in a roughly rectangular parallelepiped shape. This shape makes it possible to adopt a manufacturing method in which individual chip-type electronic components are manufactured by means of, for instance, cutting a wafer provided with a large number of chip-type electronic components, in a grid pattern. Thus, a chip-type electronic component achieving outstanding mass productivity is achieved.

Since the internal electrode film is embedded in the ceramic substrate and the external electrodes are each electrically continuous with the internal electrode film, electrical characteristics of the ceramic substrate and the internal electrode film can be extracted through the external electrodes. Also, since the internal electrode film is embedded in the ceramic substrate, the ceramic substrate renders a protective effect with respect to the internal electrode film.

By adopting the structure in which the external electrodes are provided at diametrical ends in the lengthwise direction of the ceramic substrate, a chip-type electronic component that can be mounted on a circuit board by means of soldering the external electrodes onto a conductive pattern of a circuit board or the like, is realized.

Since the flat surface in the thicknesswise direction of the ceramic substrate is provided with external electrodes, this flat surface can be soldered to the conductive pattern of a circuit board or the like. Thus, the quantity of solder flowing from under the external electrodes of the component, in directions that are toward adjacent components provided on the circuit board, can be minimized, thereby improving the mounting density at the circuit board. Also, since the surface of the internal electrode film extends almost parallel to the flat surface of the ceramic substrate in its thicknesswise direction, when the electronic component is mounted on a circuit board or the like, the internal electrode film is made to lie almost parallel to the mounting surface of the circuit board.

Furthermore, as a critical feature, by adopting the structure in which the side surfaces in the lengthwise direction of the substrate and the side surfaces in the widthwise direction of the ceramic substrate intersect each other, and the external electrodes are each formed over distances from the two side surfaces in the widthwise direction of the ceramic substrate, areas of the flat surface that cannot be soldered are formed between the external electrodes and the two side surfaces in the widthwise direction of the ceramic substrate.

Consequently, when mounting the chip-type electronic component on a circuit board, there is no room for solder fillets and the like to be formed between the external electrodes of the chip-type electronic component and an adjacent circuit element even if the distance between the chip-type electronic component and an adjacent chip-type electronic component or the distance between the chip-type electronic component and a circuit element is reduced. Thus, the mounting density on the circuit board is a greatly improved.

The chip-type electronic component in the second mode includes a ceramic substrate, at least one internal electrode film and a plurality of external electrodes. The ceramic substrate has two side surfaces in its lengthwise direction and two side surfaces in its widthwise direction that intersect each other, and is further provided with at least one flat surface in its thicknesswise direction.

The internal electrode film is embedded in the ceramic substrate. The surface of the internal electrode film intersects the flat surface of the ceramic substrate almost orthogonally and a lead-out portion is exposed to the outside of the ceramic substrate at the flat surface. The external electrodes are constituted of the lead-out portions exposed at the flat surface.

The chip-type electronic component according to the second mode described above achieves advantages similar to those achieved by the chip-type electronic component according to the first mode. The two side surfaces in the lengthwise direction of the ceramic substrate and the two side surfaces in the widthwise direction of the ceramic substrate intersect. In other words, the ceramic substrate is formed in a roughly rectangular parallelepiped shape. This shape makes it possible to adopt a manufacturing method in which individual chip-type electronic components are manufactured by means of, for instance, cutting a wafer being formed with a large number of chip-type electronic components, in a grid pattern. Thus, a chip-type electronic component achieving outstanding mass productivity can be achieved.

The internal electrode film is embedded in the ceramic substrate, with the surface of the internal electrode film extending almost perpendicular to the flat surface constituting one of the surfaces of the ceramic substrate in its thicknesswise direction and the lead-out portions exposed at the flat surface. Since the external electrodes are constituted of the lead-out portions exposed at the flat surface, the electrical characteristics of the ceramic substrate and the internal electrode film can be extracted through the external electrodes. Also, since the internal electrode film is embedded in the ceramic substrate, the ceramic substrate renders a protective effect with respect to the internal electrode film.

By adopting the structure in which the external electrodes constituted of the lead-out portions of the internal electrode film are provided at diametrical ends in the lengthwise direction of the ceramic substrate, a chip-type electronic component that can be mounted on a circuit board by means of soldering the external electrodes onto a conductive pattern of a circuit board or the like is achieved.

Since the external electrodes are constituted of the lead-out portions of the internal electrode film, they can be soldered onto the conductive pattern of the circuit board or the like, at the flat surface constituting one surface of the ceramic substrate in its thicknesswise direction. Thus, the quantity of solder flowing from under the external electrodes in the lengthwise direction of the ceramic substrate is restricted, thereby improving the mounting density at the circuit board.

By adopting the structure in which the external electrodes are each constituted of the lead-out portions of the internal electrode film and are each formed over distances from the two side surfaces in the widthwise direction of the ceramic substrate, areas of the flat surface that cannot be soldered are formed between the external electrodes and the two side surfaces in the widthwise direction of the ceramic substrate. Consequently, when mounting the chip-type electronic component on a circuit board, there is no room for solder fillets and the like to be formed between the external electrodes of the chip-type electronic component and an adjacent circuit element even if the distance between the chip-type electronic component and an adjacent chip-type component or the distance between the chip-type electronic component and a circuit element is reduced. Thus, a great improvement in the mounting density on the circuit board is achieved.

In addition, the internal electrode film is provided so that its surface extends almost perpendicular to the flat surface constituting one surface of the ceramic substrate in its thicknesswise direction, with the lead-out portions exposed to the outside of the ceramic substrate at the flat surface. The external electrodes are constituted of the lead-out portions exposed at the flat surface. With this structure, the lead-out portions, can be soldered as a means for surface mounting. The film thickness of the external electrodes constituted of the lead-out portions, which are part of the internal electrode films, is extremely small. Thus, the quantity of solder adhered to the external electrodes is extremely small so that the force applied by the molten solder to the chip-type electronic component is greatly reduced compared to that at external electrodes in the prior art. Consequently, the chip-type electronic component according to the present invention is soldered onto a circuit board with a high degree of reliability without causing floating, misalignment and the like. After the solder solidifies, the lead-out portion of the internal electrode film is connected to the conductive pattern on the circuit board or the like via the solder.

Furthermore, since no floating, misalignment or the like occurs when the chip-type electronic component is soldered to the circuit board, steps such as holding the chip-type electronic component at a specific position until the molten solder solidifies and the like are not required, thereby achieving an improvement in the efficiency with which surface mounting is implemented at a circuit board or the like.

Moreover, the film thickness of the external electrodes which are constituted of the lead-out portions that are part of the internal electrode film is extremely small. As a result, the quantity of solder adhered to the external electrodes becomes very small to greatly reduce the solder fillets formed between the external electrodes and the conductive pattern of a circuit board or the like compared to that at external electrodes in the prior art. Thus, the surface mounting density is improved.

The chip-type electronic component according to the present invention may be any of various types of chip-type electronic components such as capacitors, inductors, resistors, thermistors, varistors and the like. It may also be a combined component achieved by combining these chip-type electronic components. The material constituting the ceramic substrate and the electrical characteristics of the ceramic substrate, the type of circuit elements to be employed and the like should be selected in correspondence to the desired type of chip-type electronic component to be achieved.

For instance, the ceramic substrate should be constituted of dielectric ceramic to obtain a ceramic capacitor. In this case, by alternately laminating internal electrode films and dielectric layers, a laminated ceramic capacitor is achieved.

When obtaining an inductor, the ceramic substrate should be constituted of a magnetic substance such as ferrite with a conductor provided at the ceramic substrate. The conductor should be provided at a surface of the ceramic substrate or at the inside of the ceramic substrate, in a linear, spiral or zigzag form.

Appropriate ceramic substrate materials and circuit elements should be selected to achieve specific desired characteristics when producing other chip-type electronic components such as resistors, thermistors and varistors.

BRIEF DESCRIPTION OF THE DRAWINGS

Other objects, structural features and advantages of the present invention are explained in further detail in reference to the attached drawings. It is to be noted that the drawings are provided simply to illustrate embodiments.

FIG. 30 is a perspective of the chip-type electronic component shown in FIG. 29;

DETAILED DESCRIPTION OF THE INVENTION

Figure 1:
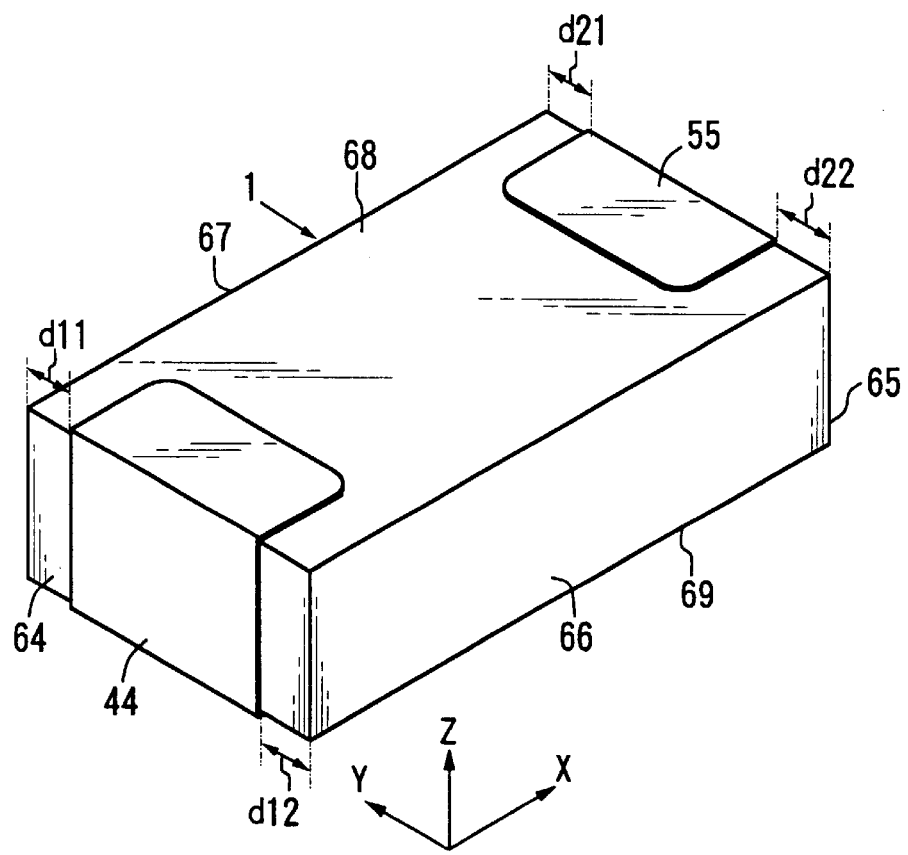
FIG. 1 is a perspective illustrating the chip-type electronic component according to the present invention.
Figure 2:
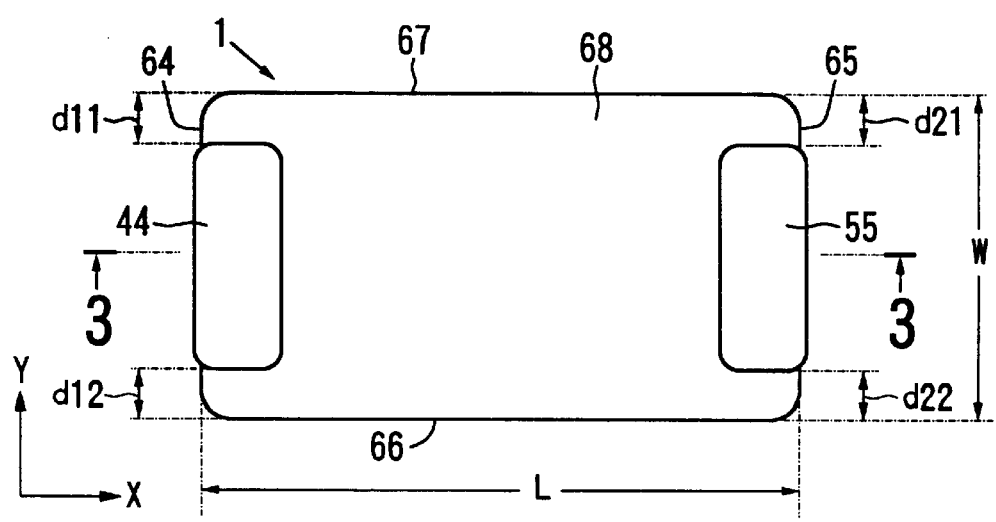
FIG. 2 is a plan view of the chip-type electronic component in FIG. 1.
Figure 3:
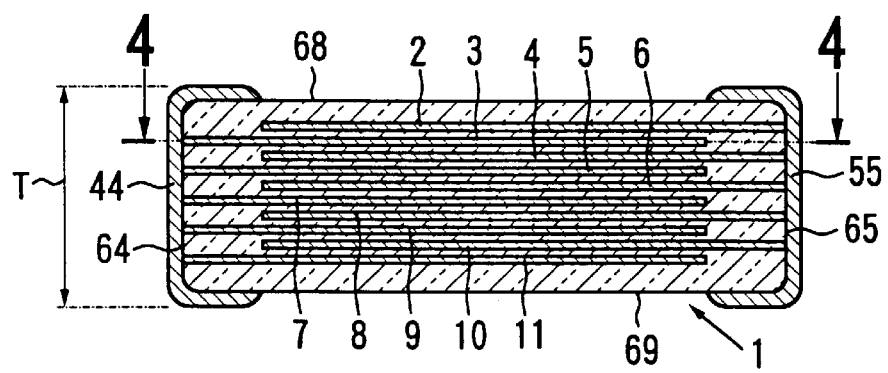
FIG. 3 is a sectional view taken along line 3—3 of FIG. 2.
Figure 4:
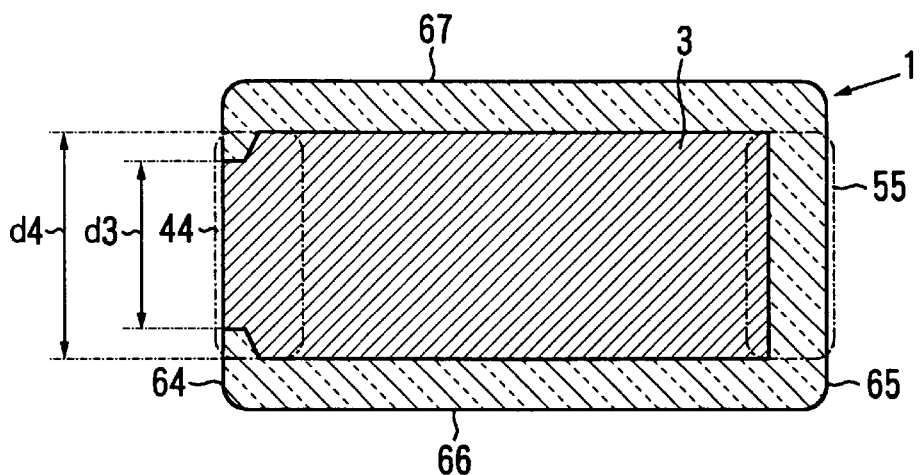
FIG. 4 is a sectional view taken along line 4—4 of FIG. 3.

Referring to FIGS. 1 to 4, the chip-type electronic component constituting a laminated ceramic capacitor, includes a ceramic substrate 1 and external electrodes 44 and 55.

At the ceramic substrate 1, two side surfaces 64 and 65 in the lengthwise direction X and two side surfaces 66 and 67 in the widthwise direction Y intersect each other. In other words, the ceramic substrate 1 achieves a roughly rectangular parallelepiped shape. This shape allows a manufacturing method in which individual chip-type electronic components are manufactured by means of cutting a wafer being formed with a large number of chip-type electronic elements in a grid pattern. Thus, a chip-type electronic component achieving outstanding mass productivity is obtained.

The dimensions of the ceramic substrate 1 are selected so as to achieve a substrate having a length of 2.2 mm or less. Typical dimensional examples for laminated ceramic capacitors include the C0603 type having a length of 0.6 mm, a width of 0.3 mm and a thickness of 0.2 mm, the C1005 type having a length of 1.0 mm, a width of 0.5 mm and a thickness of 0.4 mm, and the C2012 type having a length of 2.0 mm, a width of 1.2 mm and a thickness of 1.0 mm.

It is desirable that the dihedral angle portions where the individual surfaces intersect each other be rounded at the ceramic substrate 1. Such rounding can be achieved through barrel polishing. In the embodiment, the ceramic substrate 1 is constituted of a dielectric ceramic suitable for application in ceramic capacitors.

The ceramic substrate is provided with circuit elements. In the laminated ceramic capacitor in the embodiment illustrated in FIGS. 1 to 4, the circuit elements are constituted of internal electrode films 2 to 11 and dielectric ceramic layers provided between the individual internal electrode films 2 to 11. The internal electrode films 2 to 11 are embedded in the ceramic substrate 1 and are therefore protected by the ceramic substrate 1, so that a chip-type electronic component achieving an improvement in moisture resistance, durability, shock resistance, electrical insulation and the like is obtained.

The internal electrode films 2 to 11 are aligned in the thicknesswise direction Z and they are alternately led out to the two side surfaces 64 and 65 in the lengthwise direction X. In other words, the internal electrode films 2, 4, 6, 8 and 10 are each led out to the side surface 65, whereas the internal electrode films 3, 5, 7, 9 and 11 are each led out to the side surface 64. The number of internal electrode films is arbitrary.

The internal electrode films 2 to 11 have roughly identical flat shapes. For instance, to describe the internal electrode film 3 as a typical example, the dimension d3 of its lead-out portion in the widthwise direction Y is smaller than the dimension d4 of the external electrode 44 in the widthwise direction Y. Every second internal electrode film counting from the internal electrode film 3, namely internal electrode films 5, 7, 9 and 11, too, are formed in a shape identical to that of the internal electrode film 3. The internal electrode films 2, 4, 6, 8 and 10 have a shape achieved by laterally reversing the shape shown in FIG. 4.

Figure 5:
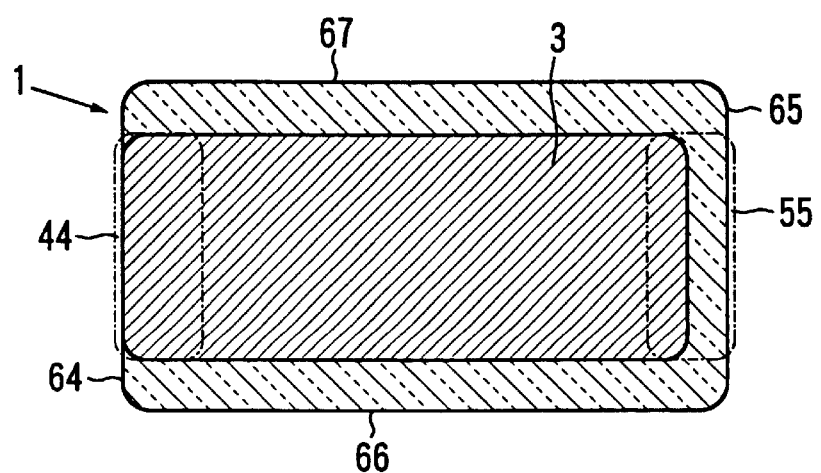
FIG. 5 illustrates another internal electrode film structure that may be adopted in the chip-type electronic component according to the present invention.

Referring to FIG. 5, the dimension d3 of the lead-out portion of the internal electrode film 3 in the widthwise direction Y is set almost equal to the dimension d4 of the external electrode 44 in the widthwise direction Y. It is to be noted that the internal electrode patterns illustrated in FIGS. 4 and 5 only represent examples, and various other patterns may be assumed.

Referring again to FIGS. 1 to 4, the external electrode 44 is provided at one of the diametrical ends of the ceramic substrate 1 in the lengthwise direction X and is formed over distances d11 and d12 respectively from the two side surfaces 66 and 67 in the widthwise direction Y. The external electrode 55, which is provided at the other one of diametrical ends of the ceramic substrate 1 in the lengthwise direction X, is formed over distances d21 and d22 respectively from the two side surfaces 66 and 67 in the widthwise direction Y.

Since the internal electrode films 3, 5, 7, 9 and 11 are each led out to the side surface 64, the external electrode 44 is made continuous to the internal electrode films 3, 5, 7, 9 and 11. Since the internal electrode films 2, 4, 6, 8 and 10 are each led out to the side surface 65, the external electrode 55 is made continuous to the internal electrode films 2, 4, 6, 8 and 10. The external electrodes 44 and 45 may be formed by adopting the technology employed in the area of this type of chip-type electronic component of the known art.

By adopting the structure described above, the electrostatic capacity determined by the number of layers of the internal electrode films 2 to 11 and the size of the area over which they face opposite one another, and the dielectric constant and the number of layers of the dielectric ceramic layers alternately provided between the internal electrode films can be extracted through the external electrodes 44 and 55.

In the embodiment shown in FIGS. 1 to 4, the external electrode 44 is formed contiguous to the side surface 64 in the lengthwise direction X and the two surfaces 68 and 69 in the thicknesswise direction Z. The external electrode 55 is formed contiguous to the side surface 65 in the lengthwise direction X and the two surfaces 68 and 69 in the thicknesswise direction Z. This assures a sufficiently large soldering area.

Figure 6:
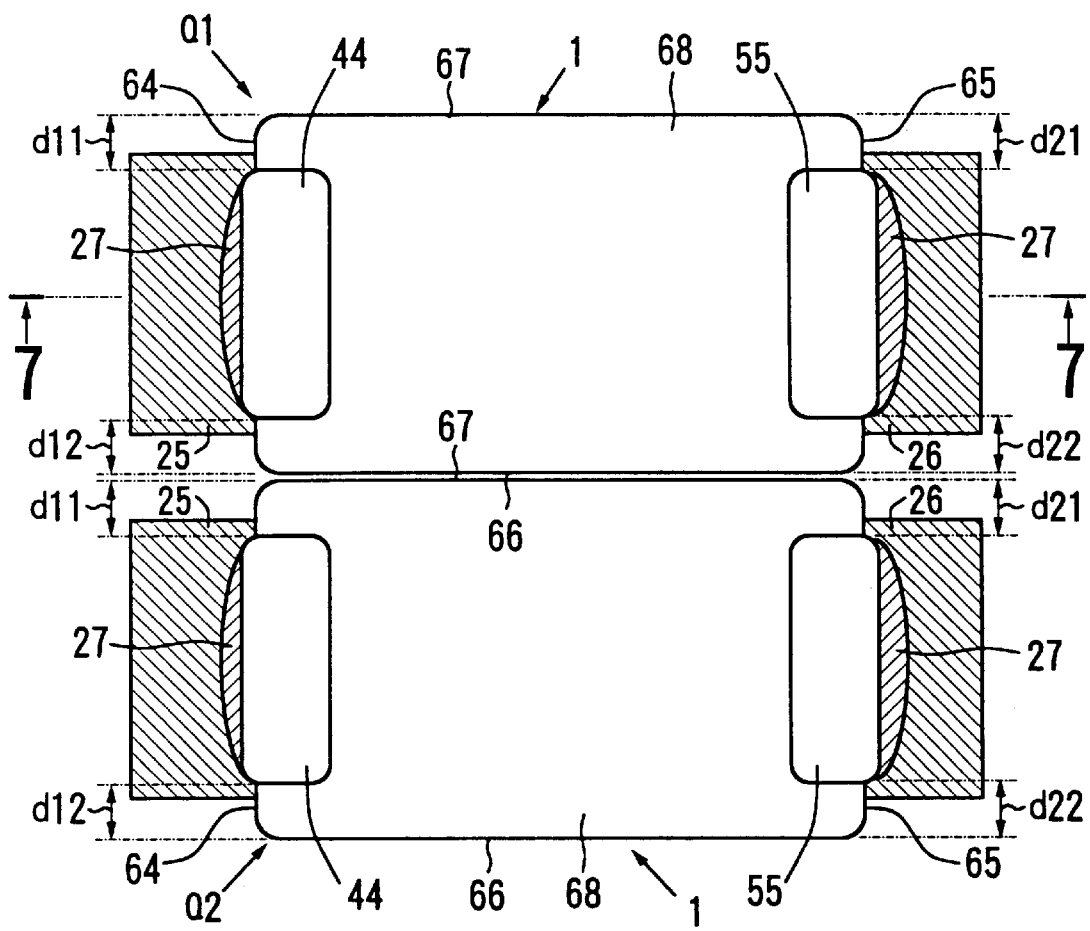
FIG. 6 illustrates the chip-type electronic component in FIGS. 1 to 5 in a mounted state.
Figure 7:
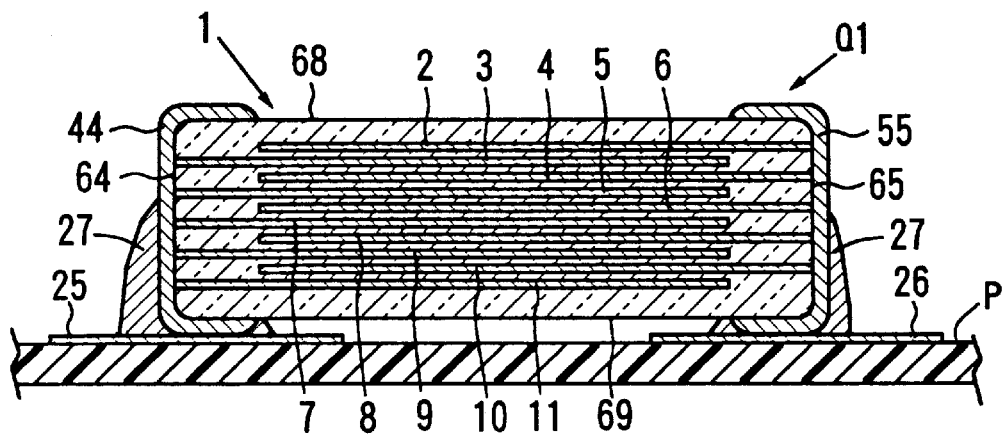
FIG. 7 is a sectional view taken along line 7—7 of FIG. 6.

Referring to FIGS. 6 and 7, in which the same reference numbers are assigned to structural features identical to those in FIGS. 1 to 5, the external electrode 44 provided at the one of the diametrical ends in the lengthwise direction X is soldered with solder 27 onto a conductive pattern 25 of a circuit board P and the external electrode 55 at the other diametrical end in the lengthwise direction X is soldered with solder 27 onto a conductive pattern 26 of a circuit board P, to mount the chip-type electronic component on the circuit board P.

In this state, since the two side surfaces 64 and 65 in the lengthwise direction X and the two side surfaces 66 and 67 in the widthwise direction Y intersect each other and the external electrode 44 is formed over the distances d11 and d12 respectively from the two side surfaces 66 and 67 in the widthwise direction Y, flat surface areas are formed between the external electrode 44 and the two side surfaces 66 and 67 over the distances d11 and d12 in the widthwise direction Y. The flat surface areas ranging over the distances d11 and d12 cannot be soldered.

Since the external electrode 55, is formed over the distances d21 and d22 respectively from the two side surfaces 66 and 67 in the widthwise direction Y, flat surface areas are formed between the external electrode 55 and the two side surfaces 66 and 67 over the distances d11 and d12 in the widthwise direction Y. The flat surface areas ranging over the distances d21 and d22 cannot be soldered.

Thus, when mounting two chip-type electronic components (Q1 and Q2) on the circuit board P, as illustrated in FIG. 6, there is no room for the formation of solder fillets and the like between the chip-type electronic components Q1 and Q2 even if the distance between the chip-type electronic components Q1 and Q2 is reduced. As a result, the mounting density at the circuit board can be greatly improved. The chip-type electronic component provided adjacent to the chip-type electronic component according to the present invention may be another type of chip-type electronic component or it may be a conductive pattern of a circuit board or the like. In these cases, too, similar advantages are achieved.

Figure 8:
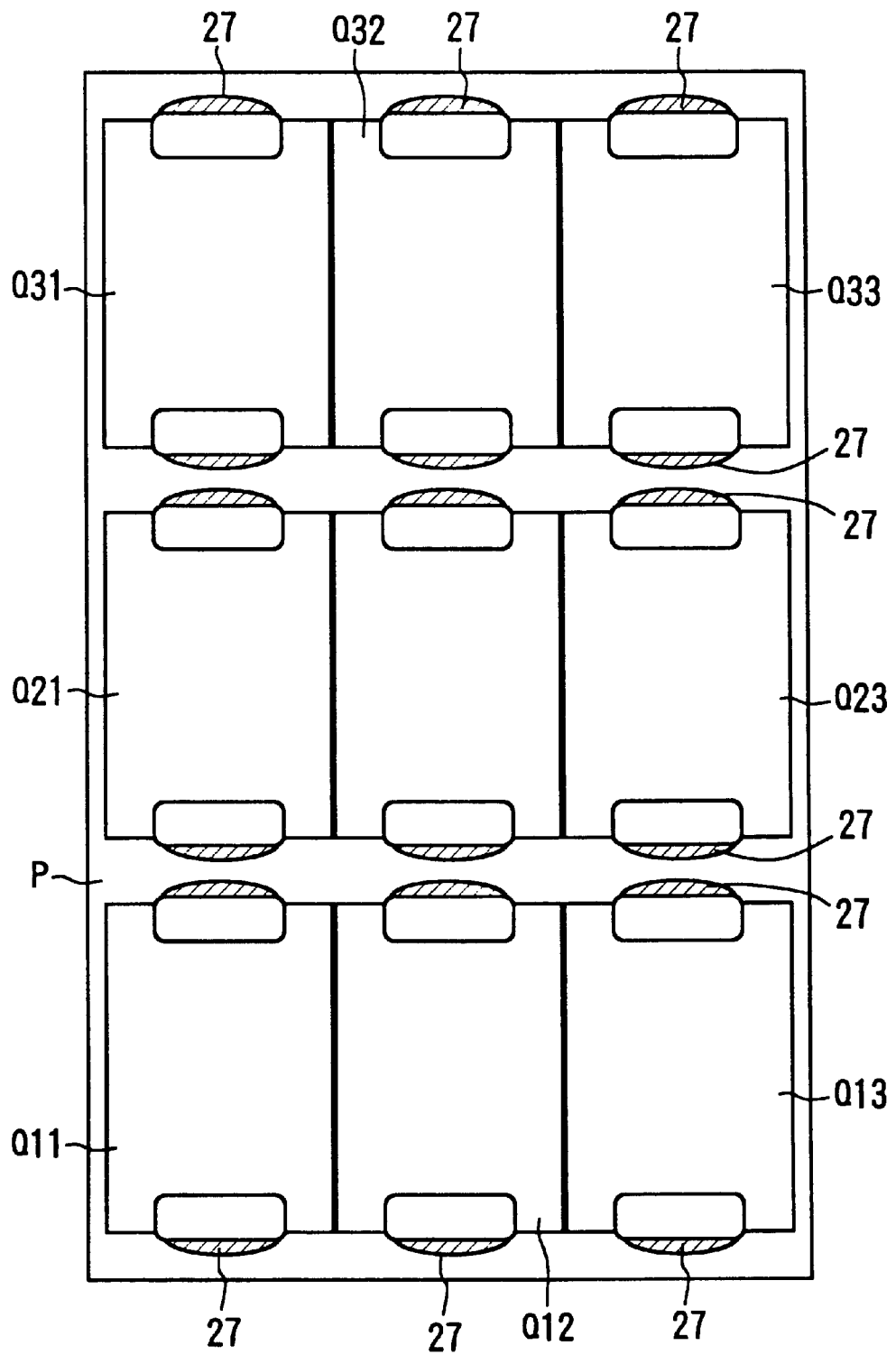
FIG. 8 shows a state in which a plurality of chip-type electronic components according to the present invention are mounted.
Figure 9:
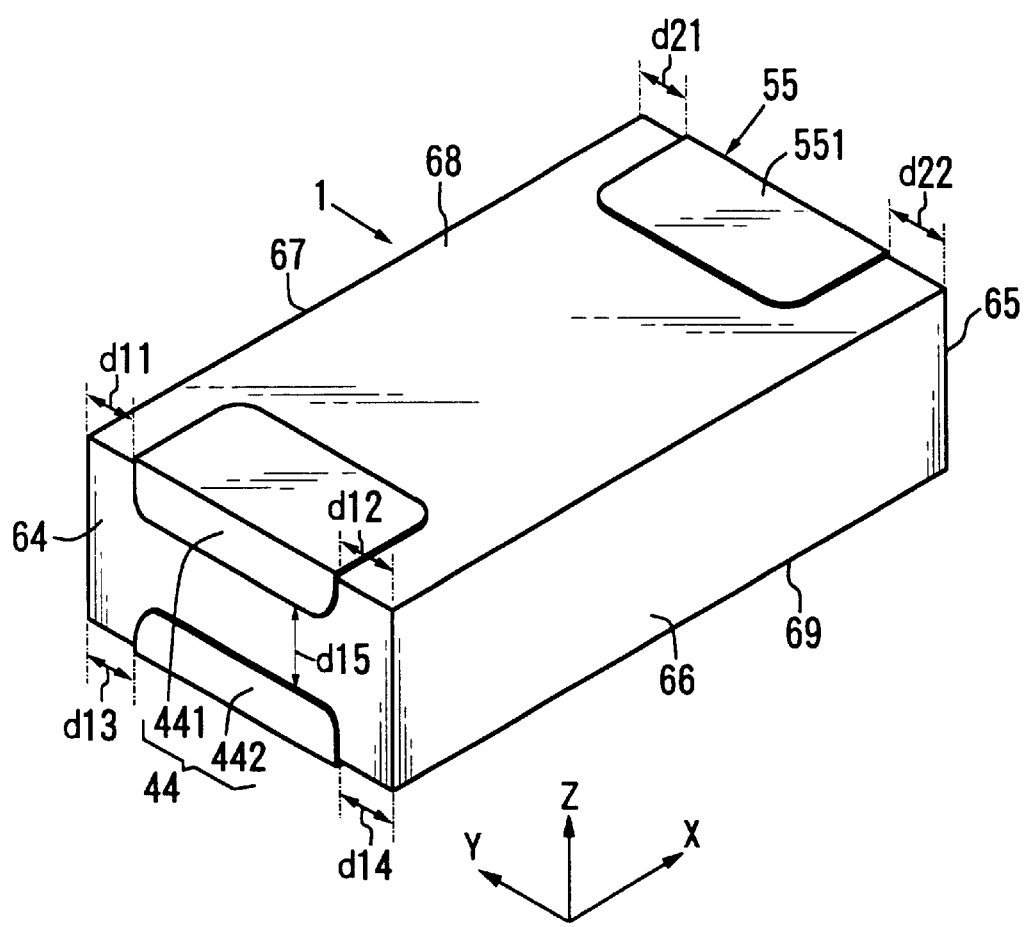
FIG. 9 is a perspective illustrating another embodiment of the chip-type electronic component according to the present invention.
Figure 10:
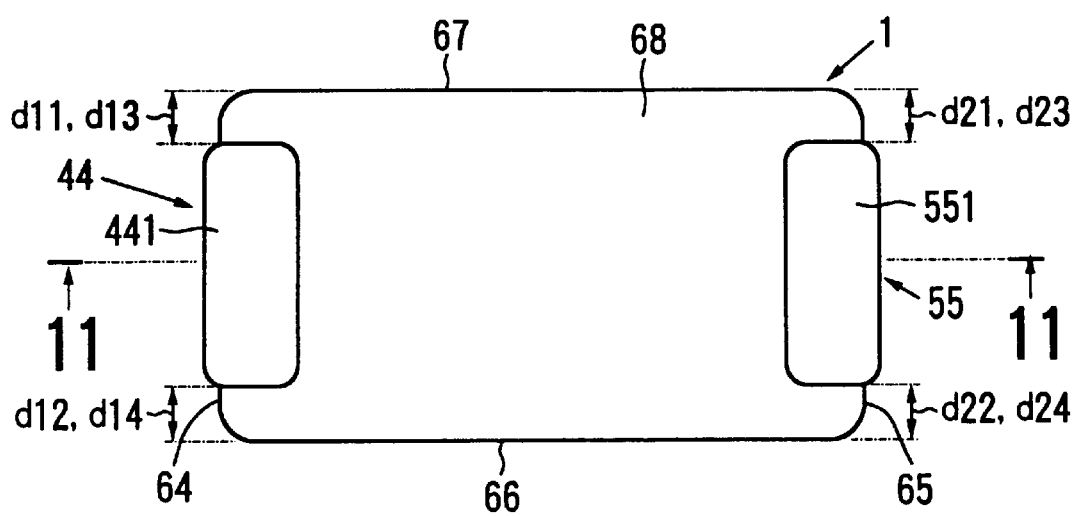
FIG. 10 is a plan view of the chip-type electronic component of FIG. 9.

Referring to FIG. 8, in which the same reference numbers are assigned to structural features identical to those in FIGS. 1 to 5, the individual chip-type electronic components Q11 to Q33 can be arrayed in the widthwise direction of the ceramic substrate over extremely small intervals, virtually abutted against each other.

It is desirable to set the distances d11, d12, d21 and d22 at 10 $\mu$m or larger. With the distances set at 10 $\mu$m or larger, the formation of solder fillets between the external electrodes 44 and 55 and another circuit element can be prevented with a high degree of reliability.

It is desirable that the external electrodes 44 and 55 occupy areas equaling 30% or more of the side surfaces 64 and 65 facing opposite each other in the lengthwise direction X to assure a sufficient soldering strength.

Referring to FIGS. 9 to 12, in which the same reference numbers are assigned to structural features identical to those in FIGS. 1 to 5, the external electrodes 44 and 55 each include a pair of electrode pieces, i.e., electrode pieces (441, 442) and (551, 552) respectively. The pair of electrode pieces 441 and 442 are provided over a distance d15 from one another in the thicknesswise direction Z at the side surface 64 in the lengthwise direction X.

Figure 11:
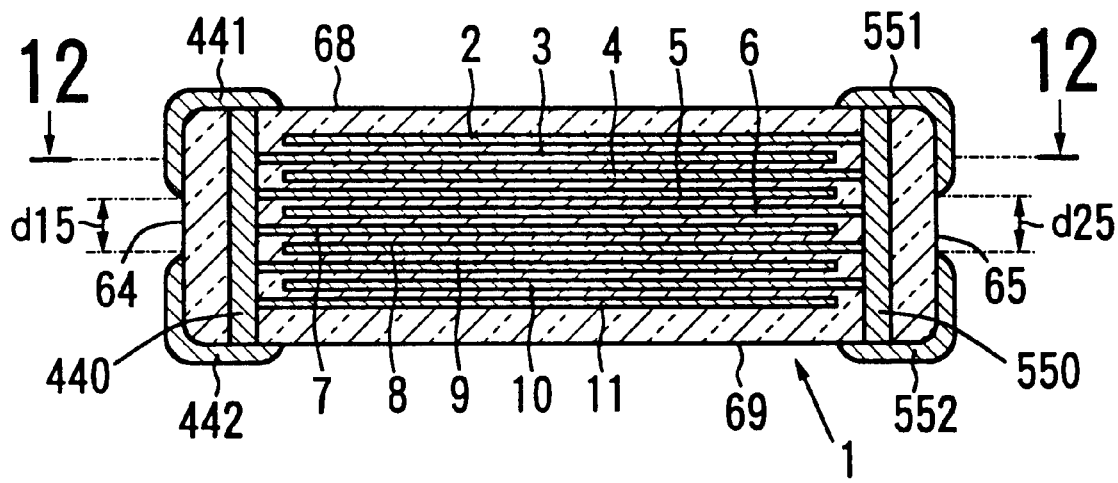
FIG. 11 is a sectional view taken along line 11—11 of FIG. 10.
Figure 12:
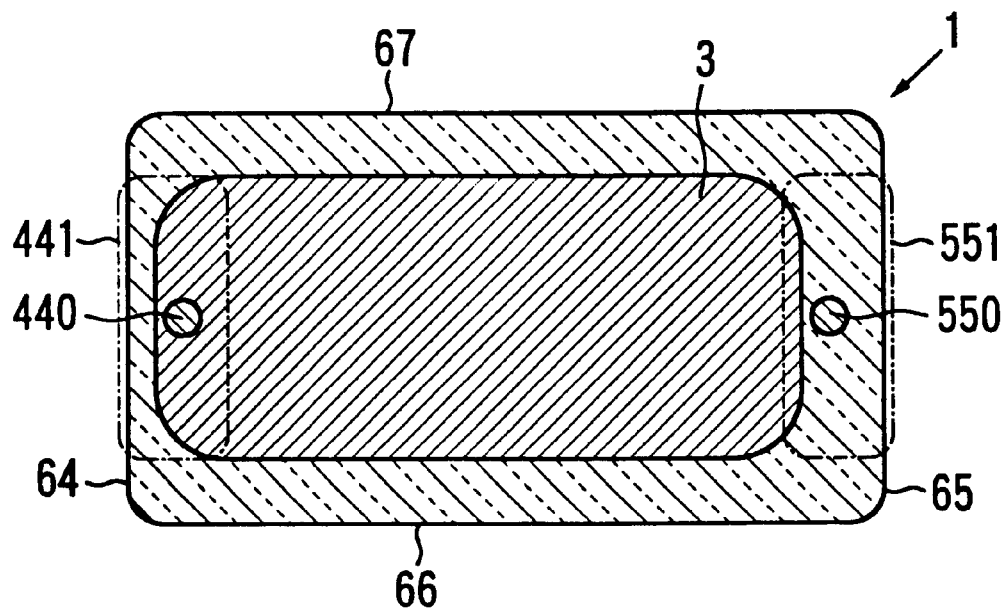
FIG. 12 is a sectional view taken along line 12—12 of FIG. 11.
Figure 13:
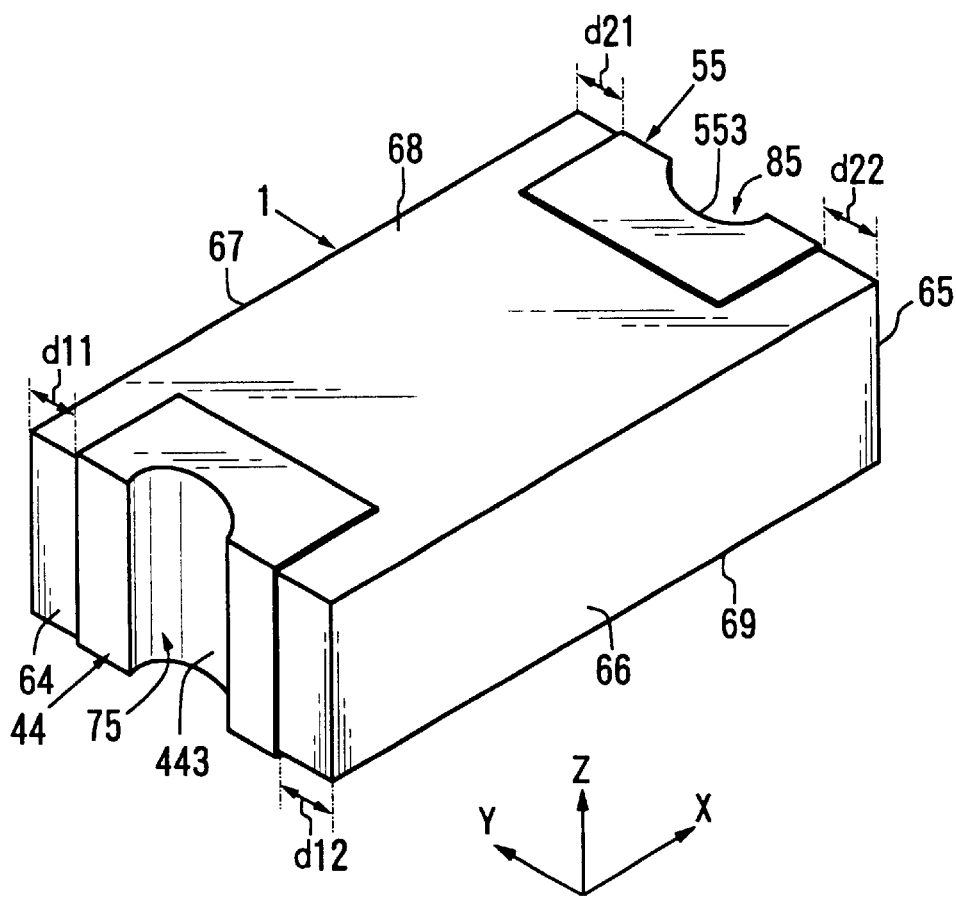
FIG. 13 is a perspective illustrating yet another embodiment of the chip-type electronic component according to the present invention.
Figure 14:
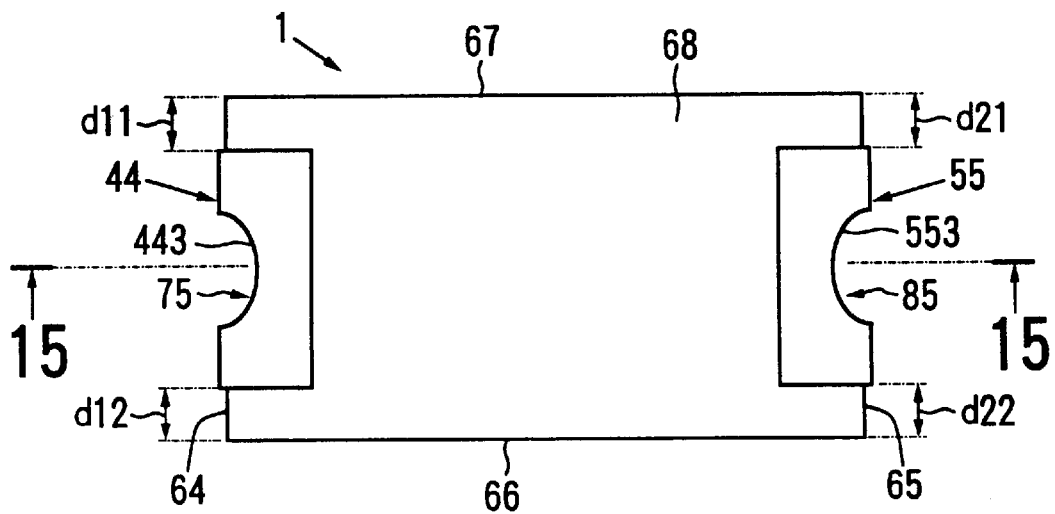
FIG. 14 is a plan view of the chip-type electronic component in FIG. 13.
Figure 15:
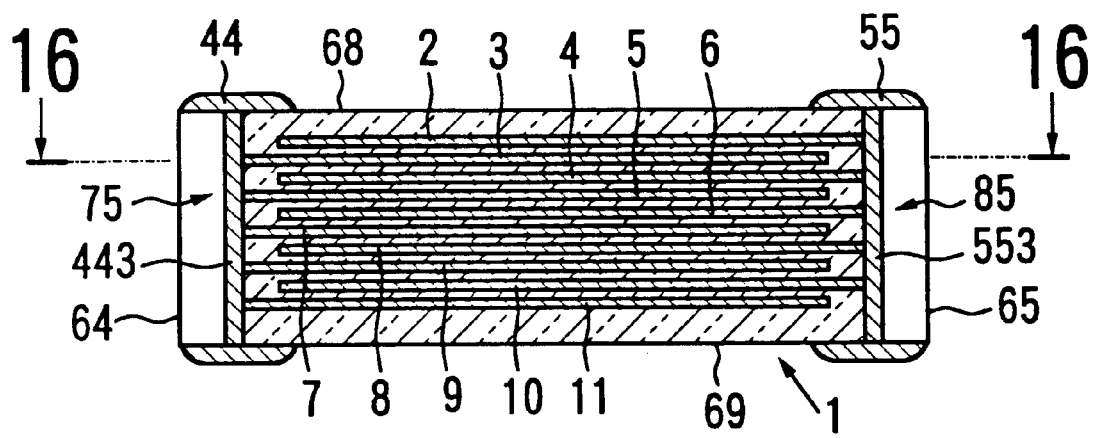
FIG. 15 is a sectional view taken along line 15—15 of FIG. 14.
Figure 16:
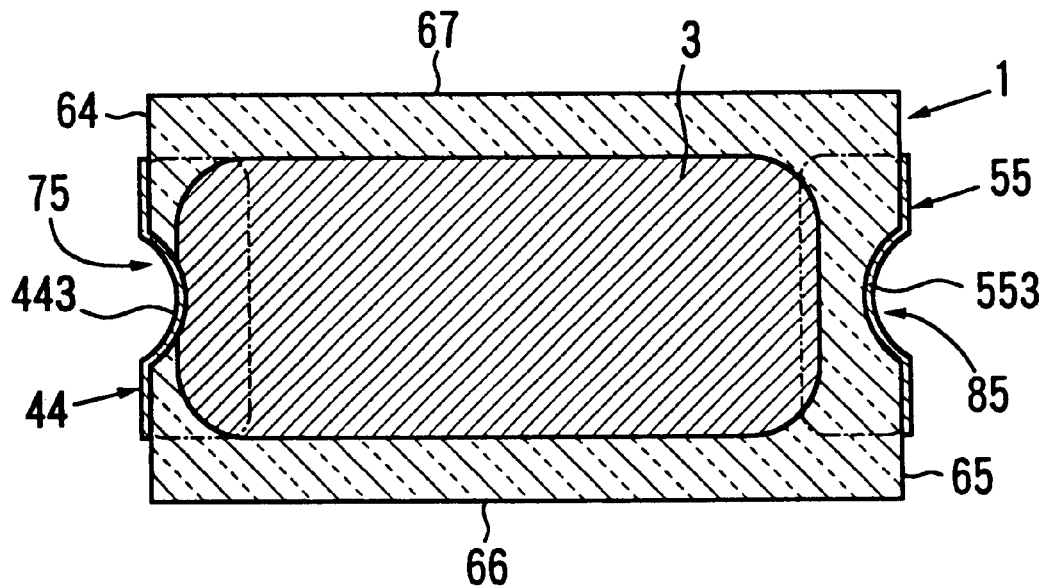
FIG. 16 is a sectional view taken along line 16—16 of FIG. 15.

Likewise, the pair of electrode pieces 551 and 552 are provided over a distance d25 from one another in the thicknesswise direction Z at the side surface 65 in the lengthwise direction X (see FIG. 11).

At the diametrical ends of the ceramic substrate 1 in its lengthwise direction X, conductors (through-hole conductors) 440 and 550 extending in the thicknesswise direction Z of the ceramic substrate 1 are embedded. The conductor 440, which is continuous with the internal electrode films 3, 5, 7, 9 and 11, is also continuous with the electrode pieces 441 and 442 at the two surfaces 68 and 69 in the thicknesswise direction Z (see FIGS. 11 and 12). The conductor 550, which is continuous with the internal electrode films 2, 4, 6, 8 and 10, is also continuous with the electrode pieces 551 and 552 at the two surfaces 68 and 69 in the thicknesswise direction Z.

In this embodiment, since the electrode piece 441 constituting the external electrode 44 is formed over the distances d11 and d12 respectively from the side surfaces 66 and 67 in the widthwise direction Y, flat surface areas that cannot be soldered are formed between the electrode piece 441 and the side surfaces 66 and 67 in the widthwise direction Y ranging over the distances d11 and d12. The other electrode piece 442 constituting the external electrode 44 is formed over distances d13 and d14 respectively from the side surfaces 66 and 67 in the widthwise direction Y and, as a result, flat surface areas that cannot be soldered are formed between the electrode piece 442 and the side surfaces 66 and 67 in the widthwise direction Y ranging over the distances d13 and d14.

In addition, since the electrode piece 551 constituting the external electrode 55 is formed over the distances d21 and d22 respectively from the side surfaces 66 and 67 in the widthwise direction Y, flat surface areas that cannot be soldered are formed between the electrode piece 551 and the side surfaces 66 and 67 in the widthwise direction Y ranging over the distances d21 and d22. Also, since the electrode piece 552 constituting the external electrode 55 is formed over the distances d23 and d24 from the side surfaces 66 and 67 in the widthwise direction Y, flat surface areas that cannot be soldered are formed between the electrode piece 552 and the side surfaces 66 and 67 in the widthwise direction Y ranging over the distances d23 and d24.

Consequently, when mounted on a circuit board, there is no room for the formation of solder fillets and the like even if the intervals between the chip-type electronic components are reduced. Thus, a great improvement in the mounting density at the circuit board is achieved.

Referring to FIGS. 13 to 16, in which the same reference numbers are assigned to structural features identical to those illustrated in FIGS. 1 to 5, the ceramic substrate 1 is provided with indented portions 75 and 85 along the thicknesswise direction Z at the middle areas in the widthwise direction Y of the two side surfaces 64 and 65 respectively. Electrode portions 443 and 553 constituting the external electrodes 44 and 55 are respectively formed at the indented portions 75 and 85. The electrode portion 443 is electrically continuous with the internal electrode films 3, 5, 7, 9 and 11 (see FIGS. 15 and 16). The electrode portion 553 is electrically continuous with the internal electrode films 2, 4, 6, 8 and 10.

Figure 17:
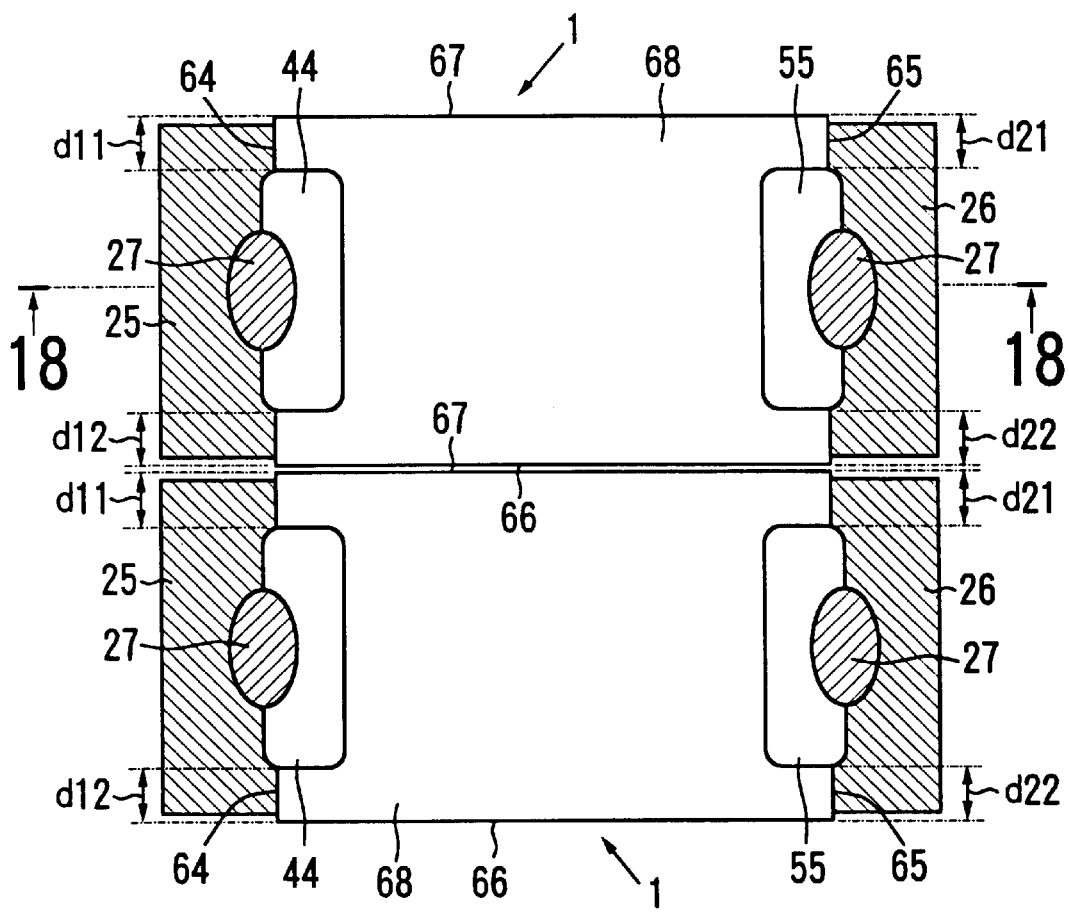
FIG. 17 is a plan view illustrating the chip-type electronic component in FIGS. 13 to 16 in a mounted state.
Figure 18:
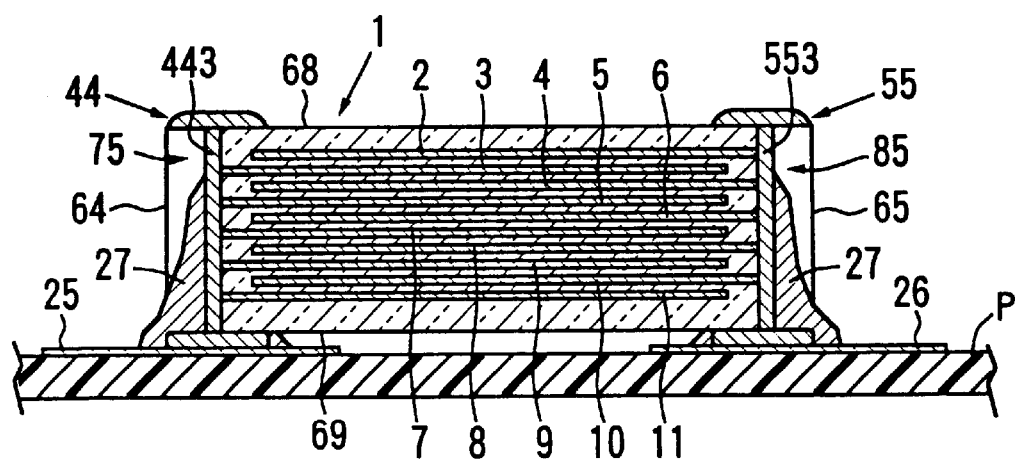
FIG. 18 is a sectional view taken along line 18—18 of FIG. 17.
Figure 19:
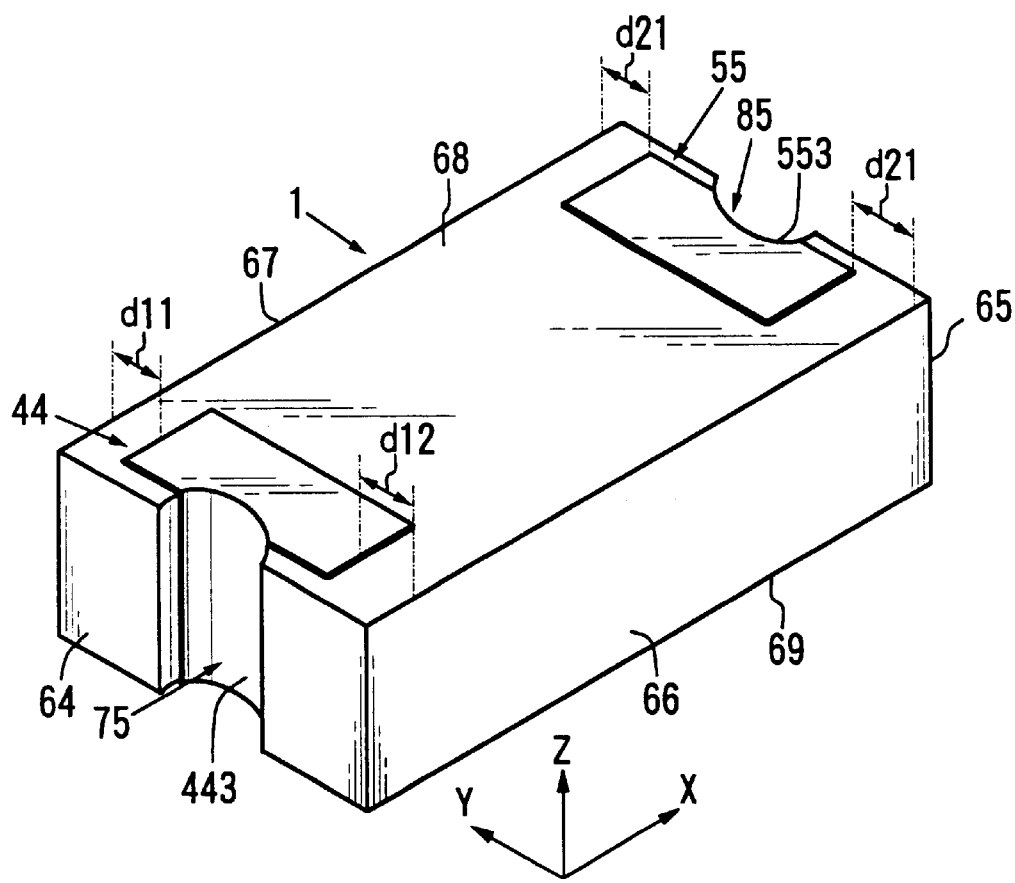
FIG. 19 is a perspective illustrating yet another embodiment of the chip-type electronic component according to the present invention.
Figure 20:
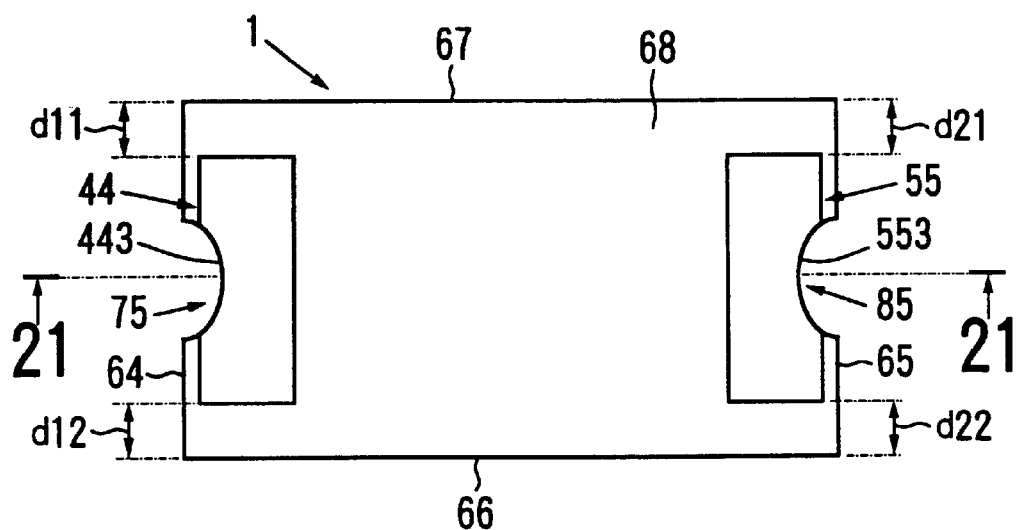
FIG. 20 is a plan view of the chip-type electronic component of FIG. 19.
Figure 21:
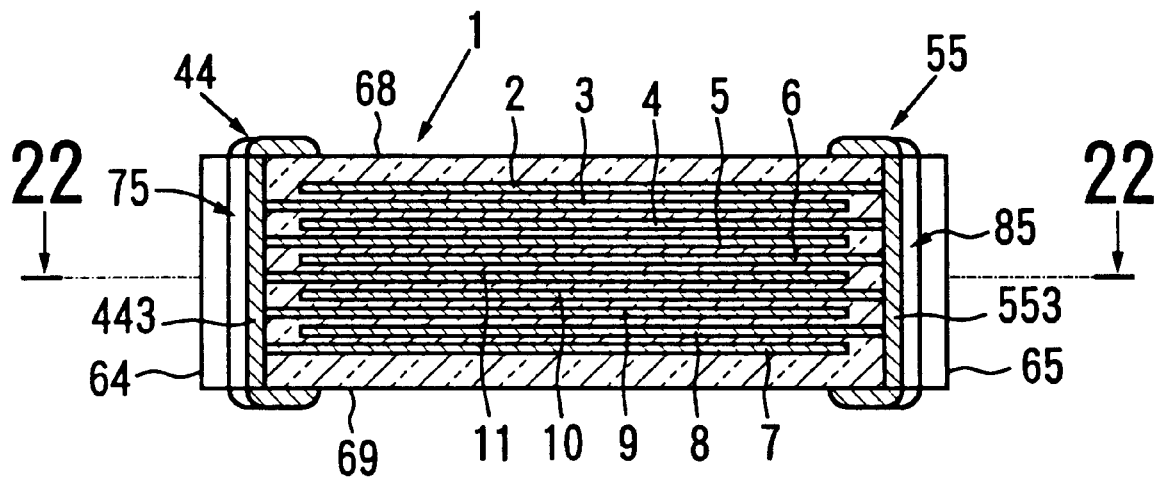
FIG. 21 is a sectional view taken along line 21—21 of FIG. 20.
Figure 22:
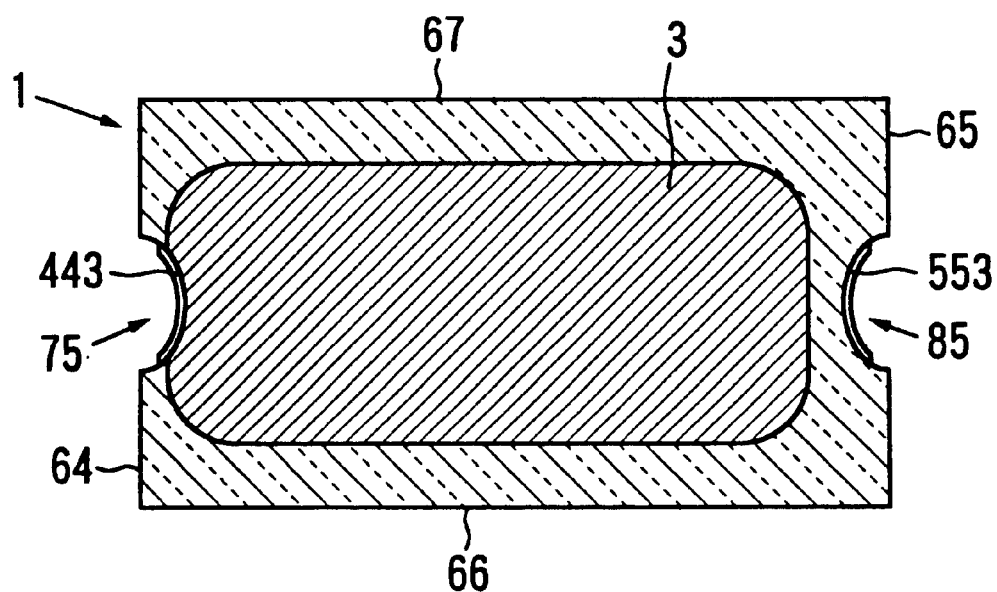
FIG. 22 is a sectional view taken along line 22—22 of FIG. 21.

Referring to FIGS. 17 and 18, in which the same reference numbers are assigned to structural features identical to those illustrated in FIGS. 13 to 16, when mounting the chip-type electronic component on a circuit board P, the external electrode 44 is soldered with solder 27 onto the conductive pattern 25 on the circuit board P and the external electrode 55 is soldered with solder 27 onto the conductive pattern 26 on the circuit board P. The soldering is mainly implemented inside the indented portions 75 and 85 and around them.

In this structure, since the external electrode 44 is formed over the distances d11 and d12 respectively from the two side surfaces 66 and 67 in the widthwise direction Y, flat surface areas are formed between the external electrode 44 and the two side surfaces 66 and 67 in the widthwise direction Y ranging over the distances d11 and d12. These flat surface areas ranging over the distances d11 and d12 cannot be soldered.

Since the external electrode 55, is formed over the distances d21 and d22 respectively from the two side surfaces 66 and 67 in the widthwise direction Y, flat surface areas are formed between the external electrode 55 and the two side surfaces 66 and 67 in the widthwise direction Y ranging over the distances d21 and d22. These flat surface areas ranging over the distances d21 and d22 cannot be soldered.

As a result, when two chip-type electronic components (Q1 and Q2) are mounted on the circuit board as illustrated in FIG. 17, there is no room for the formation of solder fillets and the like between the chip-type electronic components Q1 and Q2 even if the distance between the chip-type electronic components Q1 and Q2 is reduced. Thus, a great improvement in the mounting density at the circuit board is achieved. The chip-type electronic component provided adjacent to the chip-type electronic component according to the present invention may be another type of chip-type electronic component or it may be a conductive pattern of a circuit board or the like. In these cases, too, similar advantages are achieved.

Referring to FIGS. 19 to 22, in which the same reference numbers are assigned to structural features identical to those illustrated in FIGS. 13 to 16, this embodiment differs from the embodiment illustrated in FIGS. 13 to 16 in that the external electrodes 44 and 55 are formed inside the indented portions 75 and 85 respectively. This embodiment, too, achieves advantages similar to those explained in reference to FIGS. 13 to 16.

Next, data on the component mounting densities (quantity/cm$^2$) achieved in specific embodiments and examples for comparison are discussed.

Figure 46:
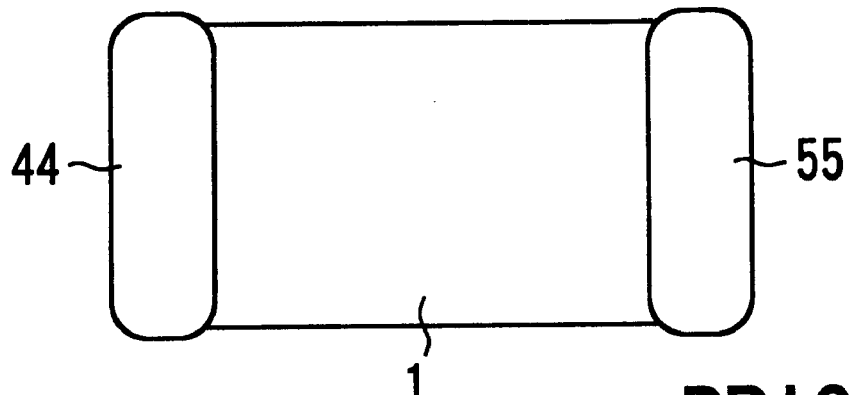
FIG. 46 is a plan view illustrating a chip-type electronic component (example for comparison 1) in the prior art.
Figure 47:
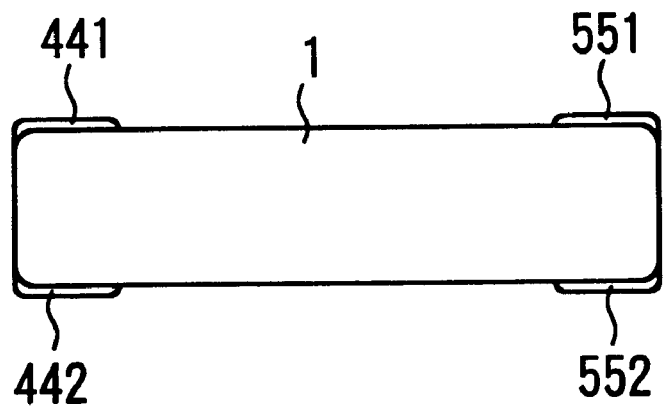
FIG. 47 is a frontal view of another chip-type electronic component (example for comparison 2) in the prior art.

The component mounting densities (quantity/cm$^2$) of three types of chip-type electronic components were examined for each of embodiments 1 to 3 and examples for comparison 1 and 2. Embodiment 1 is the chip-type electronic component illustrated in FIGS. 1 to 5, embodiment 2 is the chip-type electronic component illustrated in FIGS. 9 to 12 and embodiment 3 is the chip-type electronic component illustrated in FIGS. 13 to 16. Example for comparison 1 is the chip-type electronic component illustrated in FIG. 46 achieved by laminating the external electrodes 44 and 55 onto one side surface in the lengthwise direction, two side surfaces in the widthwise direction and two flat surfaces in the thicknesswise direction at the two diametrical ends in the lengthwise direction of the substrate 1, and example for comparison 2 is the chip-type electronic component illustrated in FIG. 47 constituted by providing the external electrodes (441, 442) and (551, 552) only at the two flat surfaces in the thicknesswise direction of the ceramic substrate 1 at the two diametrical ends in the lengthwise direction. The embodiments 1 to 3 and examples for comparison 1 and 2 were each prepared in three types, i.e., the C0603 type having a length of 0.6 mm, a width of 0.3 mm and a thickness of 0.2 mm, the C1005 type having a length of 1.0 mm, a width of 0.5 mm and a thickness of 0.4 mm, and the C2012 type having a length of 2.0 mm, a width of 1.2 mm and a thickness of 1.0 mm.

TABLE I

| | component mounting density (quantity/cm²) | | |
|---|---|---|---|
| | C0603 type | C1005 type | C2012 type |
| Embodiment 1 (FIGS. 1 to 5) | 303 | 133 | 33 |
| Embodiment 2 (FIGS. 9 to 12) | 370 | 154 | 36 |
| Embodiment 3 (FIGS. 13 to 16) | 417 | 167 | 38 |
| Example for comparison 1 | 112 | 67 | 24 |
| Example for comparison 2 | 185 | 96 | 29 |

The results in Table I demonstrate that embodiments 1 to 3 according to the present invention all achieve a great improvement in the component mounting density over examples for comparison 1 and 2.

To explain in more specific terms, the C1005 type components in embodiments 1 to 3 each achieve a mounting density that is equal to or higher than the mounting densities achieved by the C0603 type components in examples for comparison 1 and 2. Particularly marked improvement in the mounting density was achieved with the C0603 type components as in, for instance, the C0603 type component in embodiment 3 which realizes a mounting density almost four times that achieved by example for comparison 1.

Figure 23:
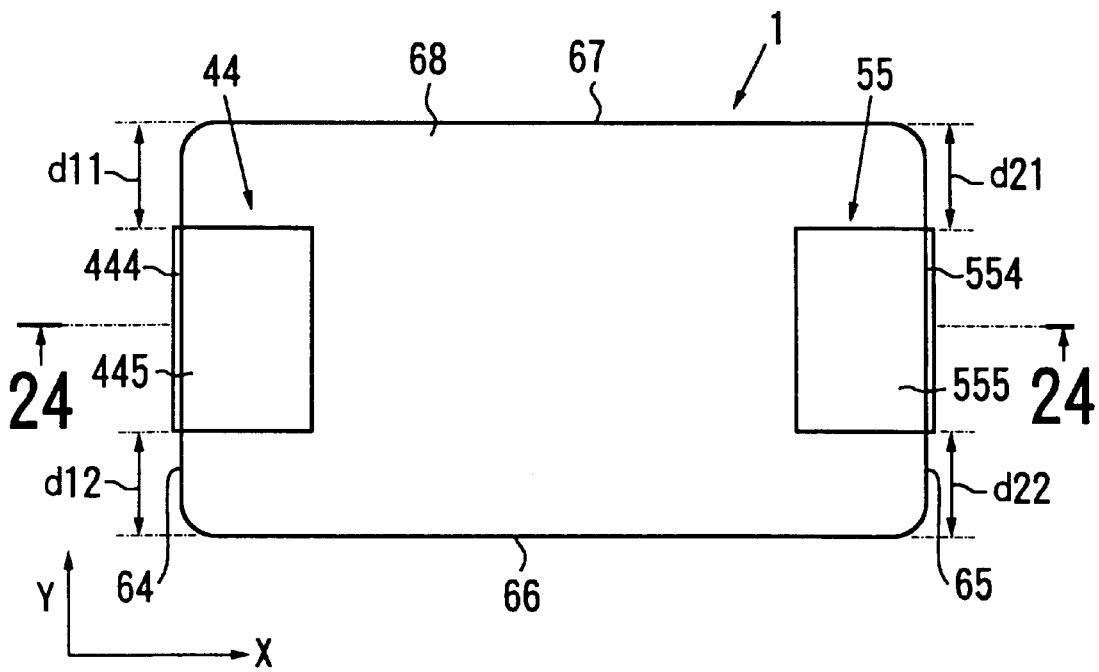
FIG. 23 is a plan view illustrating yet another embodiment of the chip-type electronic component according to the present invention.
Figure 24:
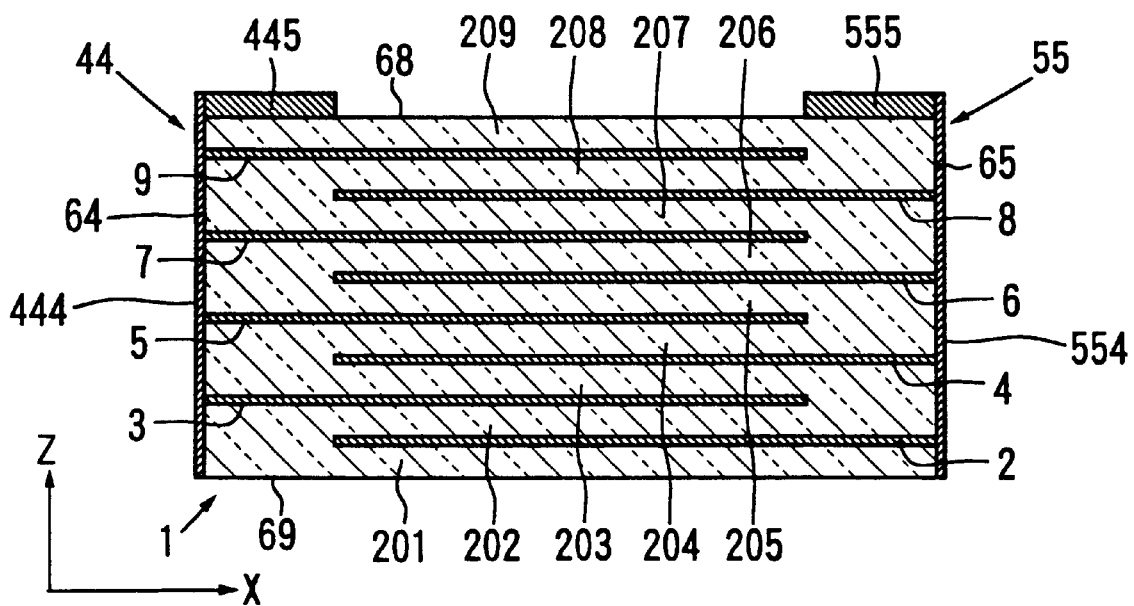
FIG. 24 is a sectional view taken along line 24—24 of FIG. 23.

Referring to FIGS. 23 and 24, in which the same reference numbers are assigned to structural features identical to those shown in the preceding drawings, the chip-type electronic component constitutes a laminated chip capacitor. The laminated chip capacitor in the figures assumes a structure achieved by alternately laminating a plurality of internal electrode films 2 to 9 and a plurality of dielectric layers 201 to 209 over a plurality of levels. Among the internal electrode films 2 to 9, one of every two adjacent internal electrode films has a lead-out portion exposed at one end in the lengthwise direction and the other one of every two adjacent internal electrode film has a lead-out portion exposed at the other end in the lengthwise direction X. The external electrodes 44 and 55 are electrically continuous with the lead-out portions of the internal electrode films 2 to 9.

The external electrode 44 includes a soldering portion 445 and a connecting portion 444. The soldering portion 445 is provided at the flat surface 68 that crosses the thicknesswise direction Z of the ceramic substrate 1. The connecting portion 444, which is provided at one side surface 64 in the lengthwise direction of the ceramic substrate 1, electrically connects the lead-out portions of the internal electrodes 3, 5, 7 and 9 to the soldering portion 445.

The external electrode 55 includes a soldering portion 555 and a connecting portion 554. The soldering portion 555 is provided at the flat surface 68 that crosses the thicknesswise direction Z of the ceramic substrate 1. The connecting portion 554, which is provided at the other side surface 65 in the lengthwise direction X of the ceramic substrate 1, electrically connects the lead-out portions of the internal electrodes 2, 4, 6 and 8 to the soldering portion 555.

The soldering portions 445 and 555 may be formed by printing conductive paste. The connecting portions 444 and 554 may be formed as a transfer film constituted of conductive paste.

The external electrode 44 is provided at a diametrical end in the lengthwise direction X and is formed over the distances d11 and d12 respectively from the two side surfaces 66 and 67 in the widthwise direction Y. The external electrode 55 is provided at the other diametrical end in the lengthwise direction X and is formed over the distances d21 and d22 respectively from the two side surfaces 66 and 67 in the widthwise direction Y.

Figure 25:
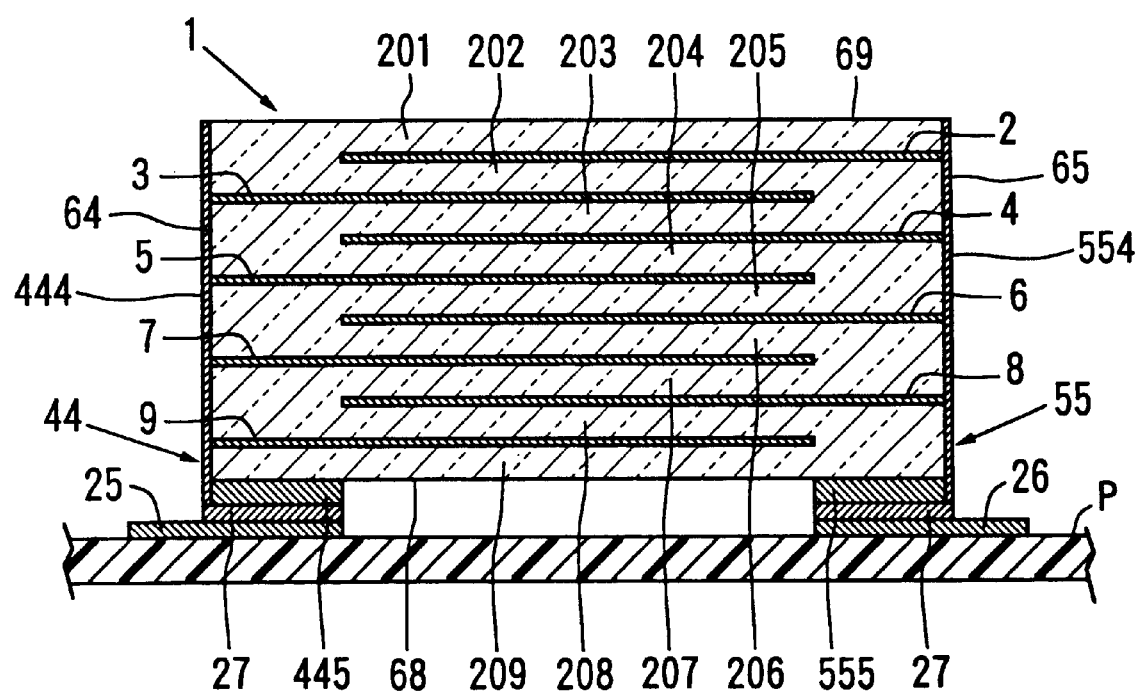
FIG. 25 illustrates an operating state of the chip-type electronic component shown in FIGS. 23 and 24.

Referring to FIG. 25, the soldering portions 445 and 555 are connected and secured to the conductive patterns 25 and 26 formed on the circuit board P with the solder 27.

As shown in the figure, when mounting the component on the circuit board P, the flat surface 68 in the thicknesswise direction X of the ceramic substrate 1 is placed facing opposite the circuit board P and the soldering portions 445 and 555 are soldered and secured to the conductive patterns 25 and 26 formed on the circuit board P with the solder 27. Thus, no solder fillet flows from under the ceramic substrate 1. Consequently, the mounting area for the capacitor itself can be minimized and, at the same time, only a minimum distance is required between itself and adjacent components to make it possible to achieve high density mounting.

To explain in further detail, flat surface areas are formed between the external electrode 44 and the two side surfaces 66 and 67 in the widthwise direction Y ranging over the distances d11 and d12. The flat surface areas ranging over the distances d11 and d12 cannot be soldered.

Also, flat surface areas are formed between the external electrode 55 and the two side surfaces 66 and 67 in the widthwise direction Y ranging over the distances d21 and d22. The flat surface areas ranging over the distances d21 and d22 cannot be soldered.

Thus, as has already been explained in reference to FIG. 6, when two chip-type electronic components are mounted on a circuit board, there is no room for the formation of solder fillets and the like between the chip-type electronic components even if the distance between the chip-type electronic components is reduced. As a result, the mounting density can be greatly improved. The chip-type electronic component to be provided adjacent to the chip-type electronic component according to the present invention may be another type of chip-type electronic component or it may be a conductive pattern of a circuit board or the like. In these cases, too, advantages similar to those explained earlier are achieved.

Figure 26:
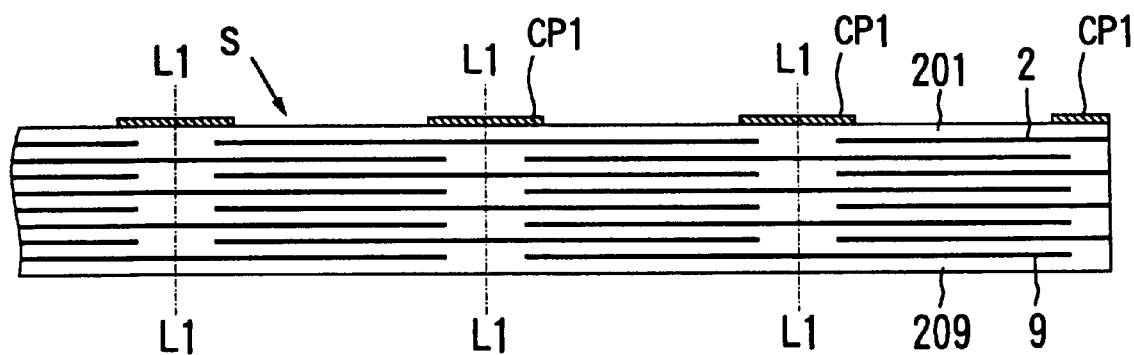
FIG. 26 illustrates a method for manufacturing the chip-type electronic component shown in FIGS. 23 and 24.

Referring to FIG. 26, a ceramic laminated substrate S having a plurality of electronic component elements Q1 to Q3 is produced. The ceramic laminated substrate S is achieved by alternately laminating the internal electrode films 2 to 9 and the dielectric layers 201 to 209.

A printed film CP1 is formed at the surface of the ceramic laminated substrate S by printing a conductive paste in a strip along cutting lines L1—L1 which corresponds to a diametrical side surface at which the lead-out portions of the internal electrode films 2 to 9 are exposed, astride both sides of the cutting lines. The printed film CP1 constituted of conductive paste may be formed through screen printing.

After drying the printed film CP1, the individual ceramic laminated substrates S are cut along the cutting lines L1—L1. Through this process, the individual electronic components Q1 to Q3 are taken out separately. The electronic components Q1 to Q3 are each provided with the soldering portions 445 and 555 constituted of the printed film CP1.

Figure 27:
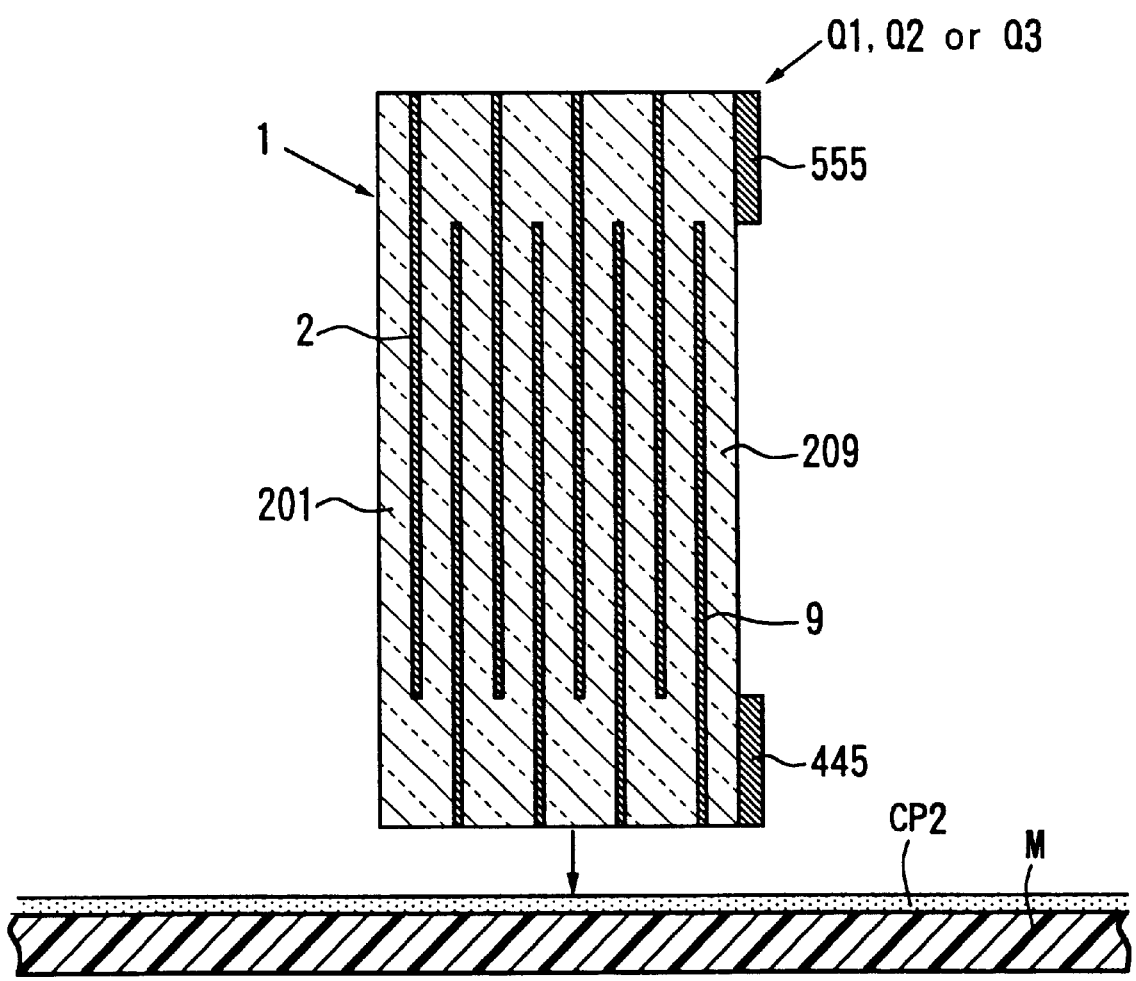
FIG. 27 illustrates a step following the manufacturing step shown in FIG. 26.
Figure 28:
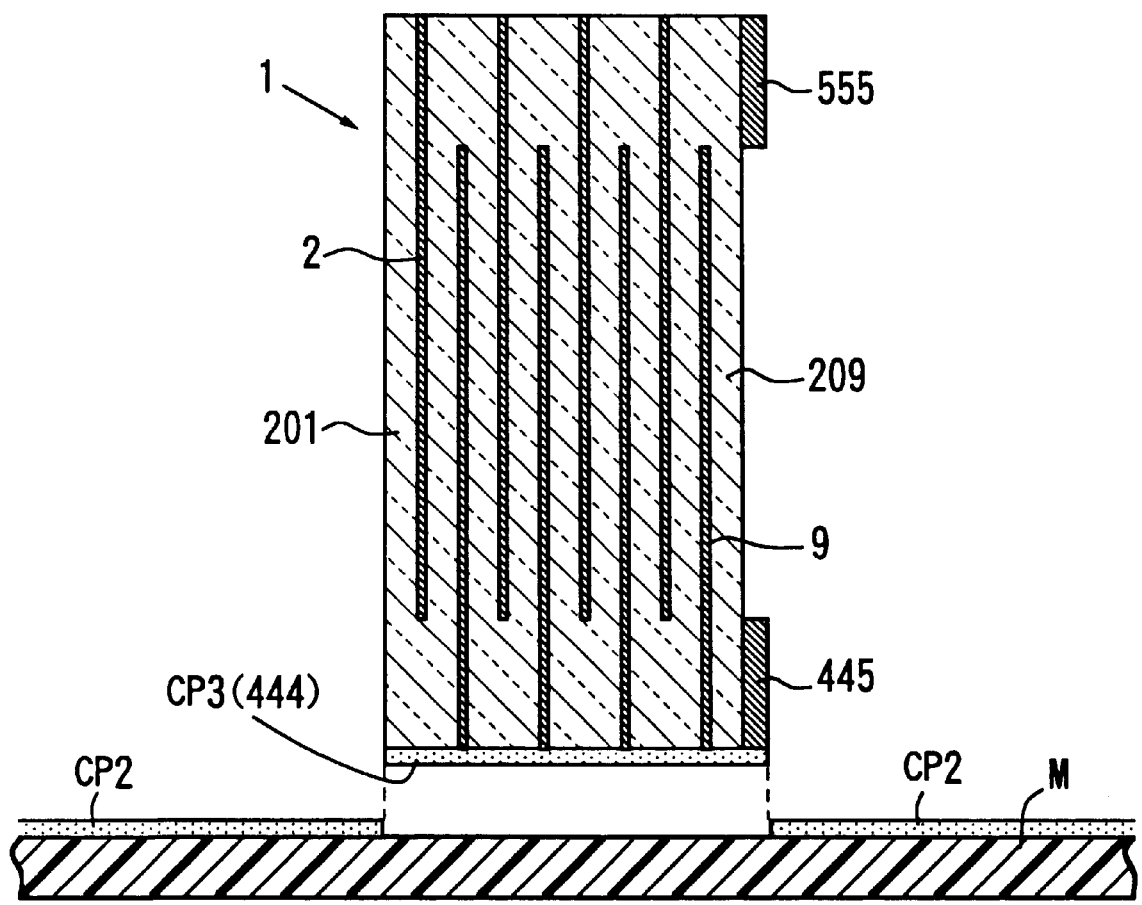
FIG. 28 illustrates a step following the manufacturing step shown in FIG. 27.

Referring to FIGS. 27 and 28, by pressing the diametrical side surfaces against conductive paste CP2, transfer films CP3 are bonded to the lead-out portions of the internal electrode films 2 to 9 as well as to the ends of the soldering portions 445 and 555. These transfer films CP3 constitute the connecting portions 444 and 554 that join the lead-out portions of the internal electrode films 2 to 9 with soldering portions 445 and 555 (see FIGS. 23 and 24).

The transfer process may be implemented by depositing the conductive paste CP2 at a peelable metalizer plate M or in a container in the form of a thin film and pressing each of the electronic components Q1 to Q3 against the thin film constituted of the conductive paste CP2. The conductive paste CP2 should be applied to achieve a film thickness of approximately 0.05 mm.

It is desirable that the external electrodes 44 and 55 ultimately assume a structure achieved by constituting base electrodes through a baking process performed on the printed film CP1 and the transfer film CP3 and laminating an electrolytic plated film constituted of nickel and then an electrolytic plated film constituted of nickel, tin or a nickel-tin alloy onto the base electrodes.

Figure 29:
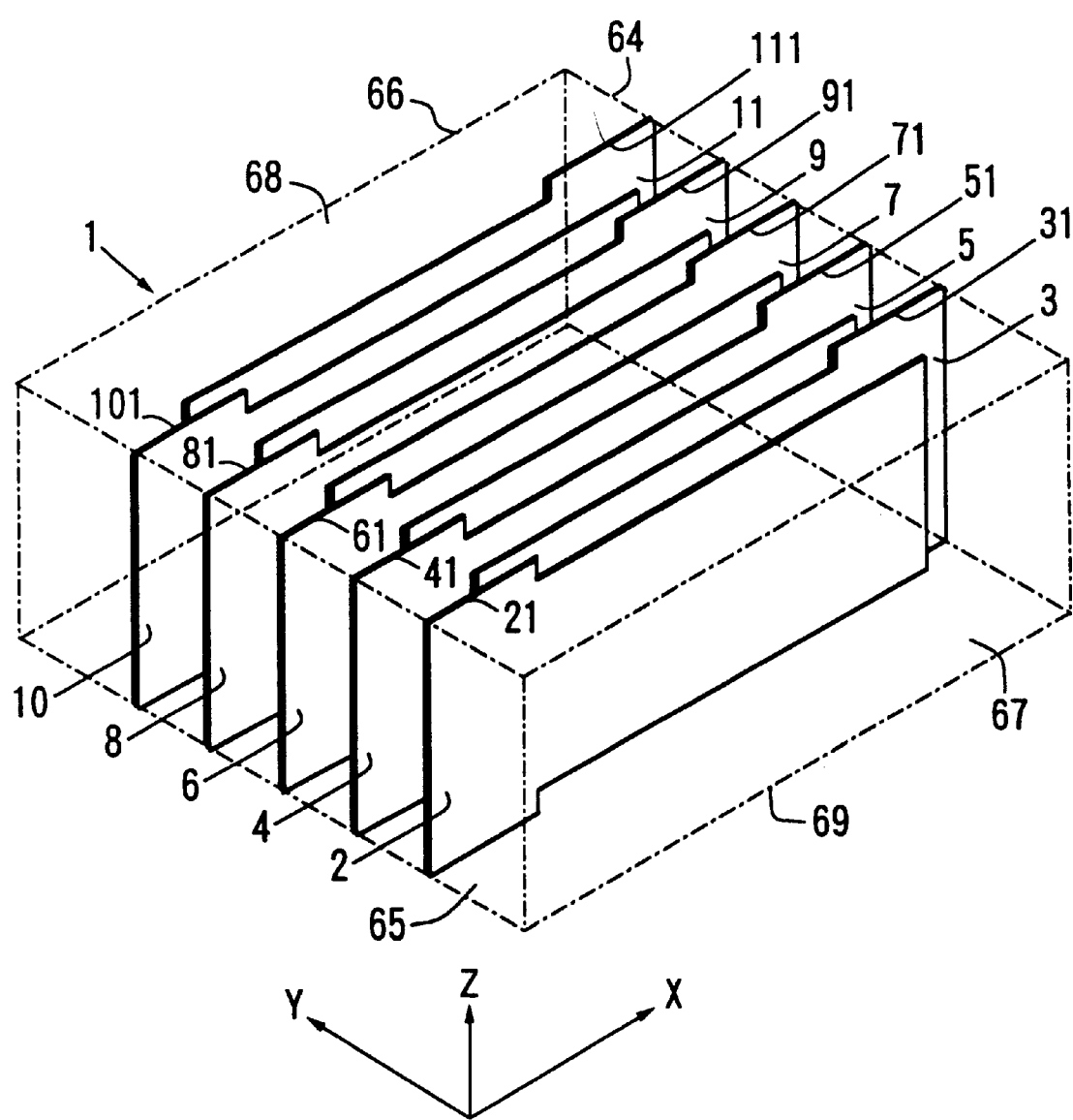
FIG. 29 is an internal perspective illustrating an embodiment of the chip-type electronic component according to the present invention.

Referring to FIGS. 29 and 30, the chip-type electronic component includes a ceramic substrate 1 and internal electrode films 2 to 11. The ceramic substrate 1 has at least one flat surface 68. The internal electrode films 2 to 11 are embedded in the ceramic substrate 1, and their lead-out portions 21 to 111 are exposed to the outside of the ceramic substrate 1 at the flat surface 68 to constitute external electrodes. In the embodiment, among the lead-out portions 21 to 111, the lead-out portions 21, 41, 61, 81 and 101 are exposed at the flat surface 68 at one diametrical end in the lengthwise direction X. The lead-out portions 31, 51, 71, 91 and 111 are exposed at the substrate surface 68 at the other diametrical end in the lengthwise direction X.

The embodiment represents a specific example in which the present invention is adopted in laminated ceramic. The ceramic substrate 1 is constituted of a roughly rectangular parallelepiped dielectric substance. Dielectric materials that may be employed to constitute laminated capacitors are of the known art, and appropriate selection may be made from these materials of the known art to be used in the embodiment.

A plurality of internal electrode films 2 to 11 are provided. The plurality of internal electrode films 2 to 11 are laminated in the widthwise direction Y of the ceramic substrate 1 alternately with dielectric layers to constitute the ceramic substrate 1. The number of internal electrode films is arbitrary. In this embodiment, a specific electrostatic capacity is obtained by determining the dielectric constant of the dielectric material constituting the ceramic substrate 1, the thickness of the dielectric layers provided between the electrodes, the total number of internal electrode films and the overlapping area.

The lead-out portions 21, 41, 61, 81 and 101 of the internal electrodes 2, 4, 6, 8 and 10, are exposed at the side surface 65 at one end in the lengthwise direction X. In the same way, lead-out portions 31, 51, 71, 91 and 111 of the internal electrodes 3, 5, 7, 9 and 11, are exposed at the side surface 64 at another end in the lengthwise direction X.

Figure 31:
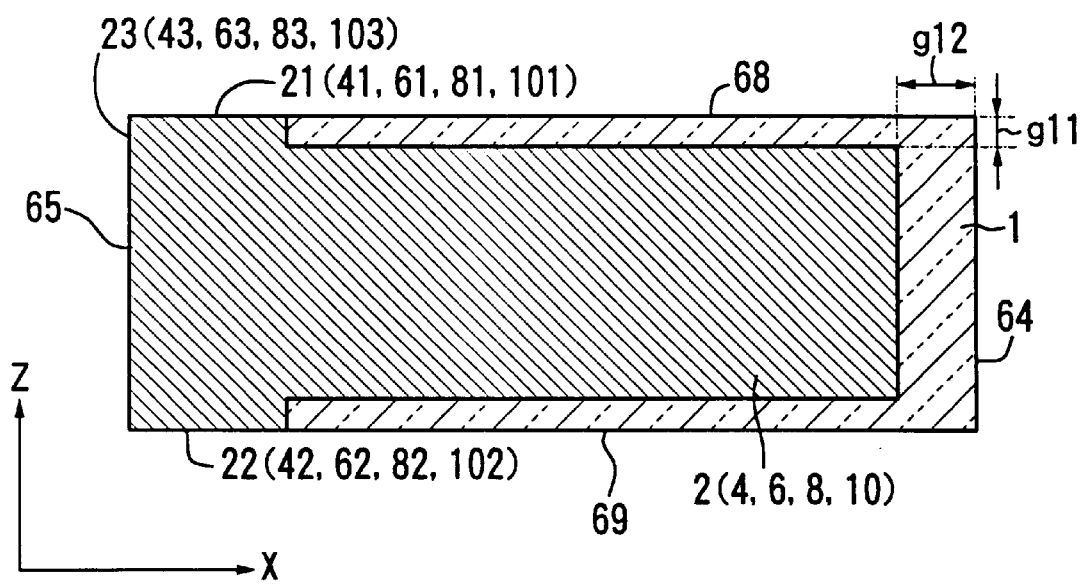
FIG. 31 is a sectional view illustrating in further detail the electrode pattern of an internal electrode film.

Referring to FIG. 31, the electrode areas of the internal electrodes 2, 4, 6, 8 and 10 are increased at one end in the lengthwise direction X. These internal electrodes are provided with lead-out portions 21, 41, 61, 81 and 101 exposed at the flat surface 68 in the thicknesswise direction Z, and lead-out portions 22, 42, 62, 82 and 102 exposed at the flat surface 69 in the thicknesswise direction Z facing opposite the flat surface 68.

The two lateral sides in the thicknesswise direction Z constituting the main portion of each of the internal electrodes 2, 4, 6, 8 and 10 are located further inward from the flat surfaces 68 and 69 over a gap g11, and another side in the lengthwise direction X is located further inward from the diametrical side surface 64 over a gap g12.

Figure 32:
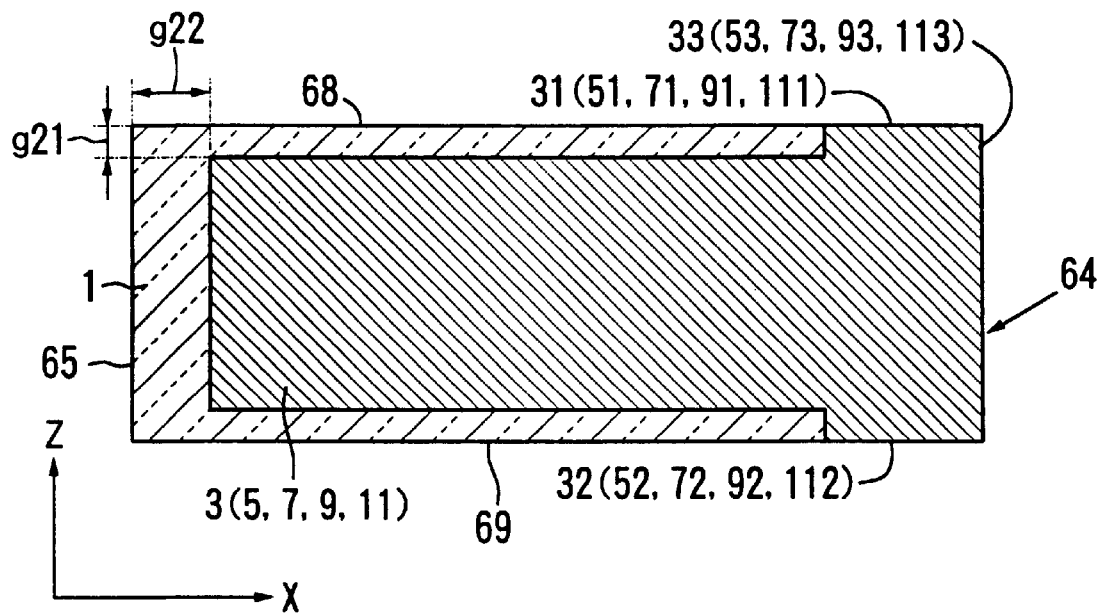
FIG. 32 is a sectional view illustrating in further detail the electrode pattern of an internal electrode film adjacent to the internal electrode film in FIG. 31.

Referring to FIG. 32, the electrode areas of the internal electrode films 3, 5, 7, 9 and 11 are increased at one end in the lengthwise direction X. These internal electrodes are provided with lead-out portions 31, 51, 71, 91 and 111 exposed at the flat surface 68 in the thicknesswise direction Z, and lead-out portions 32, 52, 72, 92 and 112 exposed at the flat surface 69 in the thicknesswise direction Z facing opposite the flat surface 68.

The two lateral sides in the thicknesswise direction Z constituting the main portion of each of the internal electrodes 3, 5, 7, 9 and 11 are located further inward from the flat surfaces 68 and 69 over a gap g21, and another side in the lengthwise direction X is located further inward from the diametrical side surface 65 over a gap g22.

Figure 33:
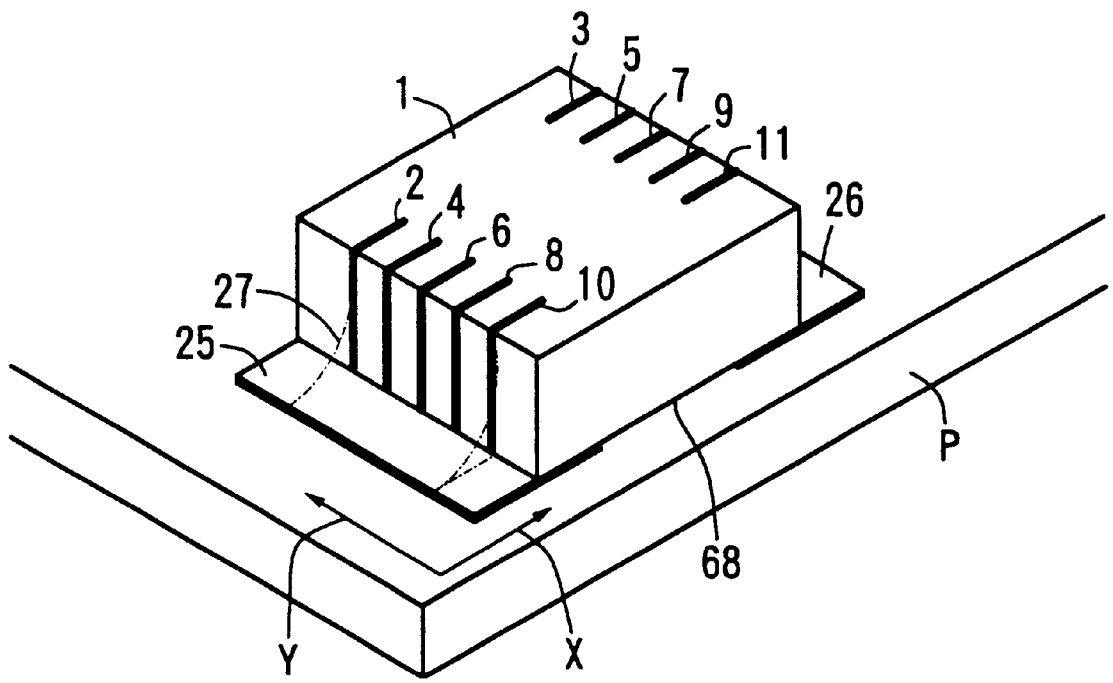
FIG. 33 is a perspective illustrating a state in which the chip-type electronic component shown in FIGS. 29 to 32 is mounted on a circuit board.

Referring to FIG. 33, the circuit board P is provided with conductive patterns 25 and 26 formed over a distance from each other, and two diametrical ends of the laminated capacitor according to the present invention are mounted onto the conductive patterns 25 and 26 by the solder 27.

Since the ceramic substrate 1 is provided with at least one flat surface 68, the chip-type electronic component can be surface mounted by positioning the flat surface 68 opposite the circuit board P.

Since the lead-out portions 21 to 111 (see FIG. 30) of the internal electrode films 2 to 11 are exposed to the outside of the ceramic substrate 1 at the flat surface 68, these lead-out portions that are utilized as the external electrodes can be surface mounted onto the conductive patterns 25 and 26 by the solder 27.

Since the external electrodes are constituted of the lead-out portions 21 to 111 that are part of the internal electrode films 2 to 11 respectively, their film thickness is extremely small.

Figure 34:
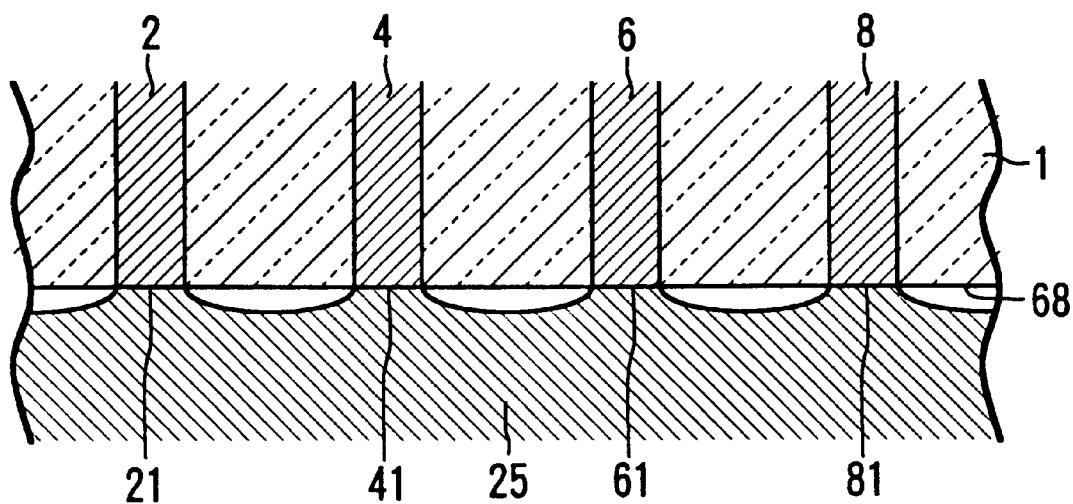
FIG. 34 is a partial sectional view of the mounted state in FIG. 33 in an enlargement.

Thus, as illustrated in FIG. 34, the quantity of solder 27 adhered to the external electrodes constituted of the lead-out portions 21 to 111 is reduced to a great degree so that the force applied by the molten solder to the laminated capacitor is greatly reduced compared to that applied in a structure using terminal electrodes in the prior art. Consequently, the chip-type electronic component according to the present invention can be soldered onto the circuit board P with a high degree of reliability by preventing floating and misalignment. After the solder becomes solidified, the lead-out portions 21 to 111 of the internal electrode films 2 to 11 become connected to the conductive patterns 25 and 26 of the circuit board P via the solder 27.

In addition, since no floating, misalignment or the like occurs with the chip-type electronic component according to the present invention when it is soldered to the circuit board P, steps such as holding the laminated capacitor at a specific position until the molten solder solidifies are not required. As a result, the efficiency with which the chip-type electronic component is surface mounted on the circuit board P or the like improves.

Furthermore, since the external electrodes are constituted of the lead-out portions 21 to 111, which are part of the internal electrode films 2 to 11 respectively, their film thickness is extremely small. Thus, the quantity of solder adhered to the external electrodes constituted of the lead-out portions 21 to 111 is reduced to a great degree so that solder fillets formed between the external electrodes and the conductive patterns 25 and 26 are greatly reduced compared with a structure employing terminal electrodes in the prior art. As a result, an improvement in the surface mounting density is achieved with the chip-type electronic component according to the present invention.

In the embodiment, the lead-out portions 21, 41, 61, 81 and 101 are exposed at the flat surface 68 at one diametrical end in the lengthwise direction X, whereas the lead-out portions 31, 51, 71, 91 and 111 are exposed at the flat surface 68 at the other diametrical end in the lengthwise direction X. This structure allows the soldering (27) to be implemented at both diametrical ends of the ceramic substrate 1, thereby improving the soldering strength.

In addition, the plurality of internal electrode films 2 to 11 are laminated in the widthwise direction Y of the ceramic substrate 1. The dielectric layers constituting the ceramic substrate 1 are provided between the individual internal electrode films 2 to 11. Lead-out portions 21, 41, 61, 81 and 101 of the internal electrodes 2, 4, 6, 8 and 10 are exposed on the flat surface 68 at one diametrical end in the lengthwise direction X. Lead-out portions 31, 51, 71, 91 and 111 of the internal electrode films 3, 5, 7, 9 and 11 are exposed on the flat surface 68 at the other diametrical end in the lengthwise direction X.

By adopting this structure, even when thin internal electrode films are employed, the solder bonding area that corresponds to the total number of films can be assured to ensure that sufficient soldering strength is achieved. For instance, even when thin internal electrode films having a thickness of approximately 2 to 4 $\mu m$ are used, by selecting the total number of internal electrode films at 30, a solder bonding area of approximately 60 to 120 $\mu m$ can be assured to withstand practical use in a satisfactory manner.

Furthermore, the electrode areas of the internal electrodes 2, 4, 6, 8 and 10 are increased at one end in the lengthwise direction X. These internal electrodes are provided with end surfaces 23, 43, 63, 83 and 103 exposed at the diametrical side surface 65 in the lengthwise direction X and lead-out portions 22, 42, 62, 82 and 102 exposed at the flat surface 69 facing opposite the flat surface 68. The electrode areas of the internal electrodes 3, 5, 7, 9 and 11 are increased at one end in the lengthwise direction X. These internal electrodes are provided with the end surfaces 33, 53, 73, 93 and 113 respectively exposed that the diametrical side surface 64 in the lengthwise direction X and lead-out portions 32, 52, 72, 92 and 112 exposed at the flat surface 69 facing opposite the flat surface 68.

As a result, in the embodiment, the internal electrode films 2, 4, 6, 8 and 10 provide a three-dimensionally arrayed external electrode that includes three sets of lead-out portions, i.e., lead-out portions (21, 41, 61, 81 and 101), lead-out portions (22, 42, 62, 82 and 102) and lead-out portions (23, 43, 63, 83 and 103). The internal electrode films 3, 5, 7, 9 and 11 assigned with odd reference numbers provide a three-dimensionally arrayed external electrode that includes three sets of lead-out portions, i.e., lead-out portions (31, 51, 71, 91 and 111), lead-out portions (32, 52, 72, 92 and 112) and lead-out portions (33, 53, 73, 93 and 113). Thus, even when the film thickness is very small, a sufficient degree of soldering strength and a sufficient degree of reliability can be assured.

Furthermore, the internal electrode films 2, 4, 6, 8 and 10 are respectively provided with lead-out portions (21, 41, 61, 81 and 101) and lead-out portions (22, 42, 62, 82 and 102) that are exposed at the two flat surfaces 68 and 69 respectively in the thicknesswise direction Z. The internal electrode films 3, 5, 7, 9 and 11 are respectively provided with lead-out portions (31, 51, 71, 91 and 111) and lead-out portions (32, 52, 72, 92 and 112) that are exposed at the two flat surfaces 68 and 69 respectively in the thicknesswise direction Z. Consequently, there is no directionality in the thicknesswise direction Z. Thus, the process for identifying the thicknesswise direction Z is not required during the mounting work to improve the efficiency of the mounting process.

The internal electrode films 2, 4, 6, 8 and 10 are not required to have all of the lead-out portions, i.e., lead-out portions (21, 41, 61, 81 and 101), (22, 42, 62, 82 and 102) and (23, 43, 63, 83 and 103) respectively. They are each only required to have one type of lead-out portion. For instance, a structure may be assumed in which they are respectively provided only with lead-out portions (21, 41, 61, 81 and 101), or lead-out portions (22, 42, 62, 82 and 102) or lead-out portions (23, 43, 63, 83 and 103). Or they may each have a combination of two types of lead-out portions. The same principle applies to the internal electrode films 3, 5, 7, 9 and 11.

Figure 35:
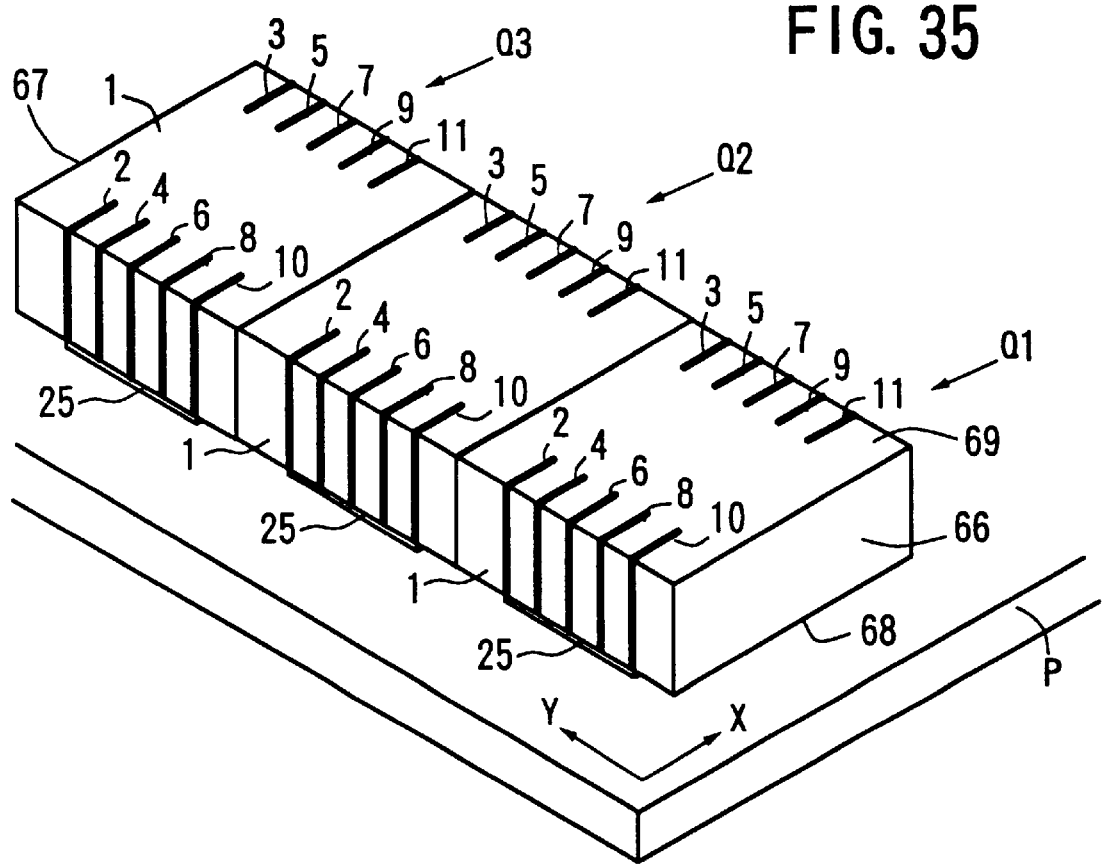
FIG. 35 is a perspective illustrating another state in which the chip-type electronic component in FIGS. 29 to 32 is mounted on a circuit board.

Referring to FIG. 35, the conductive patterns 25 and 26 (reference number 26 not shown) formed on the circuit board P are provided under the chip-type electronic component. When such a surface mounting structure is adopted, lead-out portions exposed at the flat surface 68 of the ceramic substrate 1 can be utilized as external electrodes to implement soldering.

Furthermore, since the side surfaces 66 and 67 of the ceramic substrate 1 where no solder adheres are present in the widthwise direction Y, there is no room for the formation of solder fillets and the like between the individual chip-type electronic components Q1, Q2 and Q3 even when the plurality of chip-type electronic components Q1, Q2 and Q3 are mounted sequentially in the widthwise direction Y of the ceramic substrate 1 by allowing only the minimum intervals between them. Thus, a great improvement in the mounting density is achieved. By adopting this mounting structure, the mounting density can be further improved.

Figure 36:
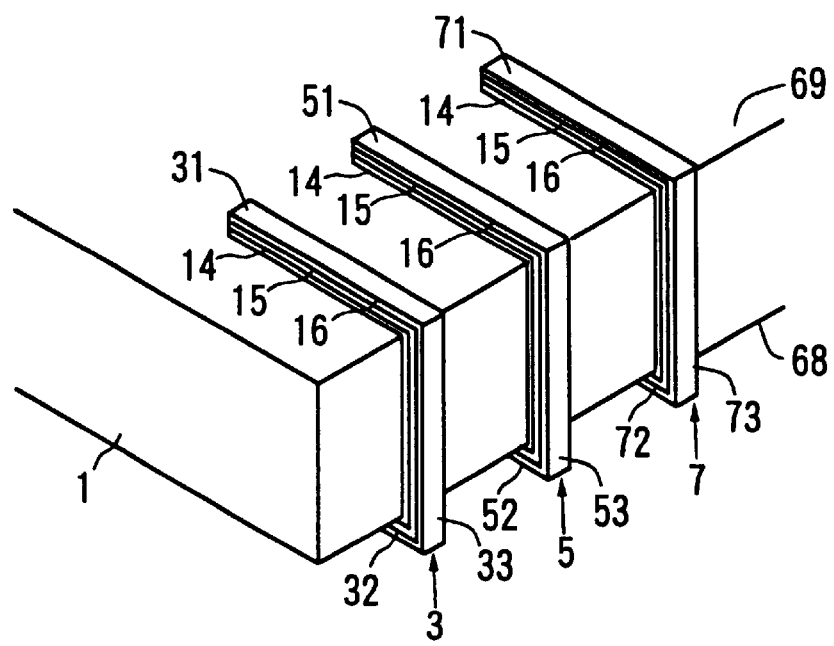
FIG. 36 is a partial enlargement illustrating yet another embodiment of the chip-type electronic component according to the present invention.

Referring to FIG. 36, the lead-out portions 31, 51 and 71 of respective internal electrode films 3, 5 and 7 are each provided with plated films 14, 15 and 16 at the front surface thereof. Since the lead-out portions 31, 51 and 71 are exposed to the outside of the ceramic substrate 1, it is possible to form the plated films described above. Although not shown, the other internal electrode films 2, 4, 6 are each provided with similar plated films.

By adopting such a structure, advantages such as an improvement in the soldering, the prevention of oxidation of the internal electrode films 2 to 11 and the prevention of solder corrosion can be achieved through appropriate selection made in regard to the plating material, the plated film structure and the like. It is desirable to constitute the plated films 14 with a Cu electroplated film, the plated films 15 with an Ni plated film and the plated films 16 with an Sn plated film.

Figure 37:
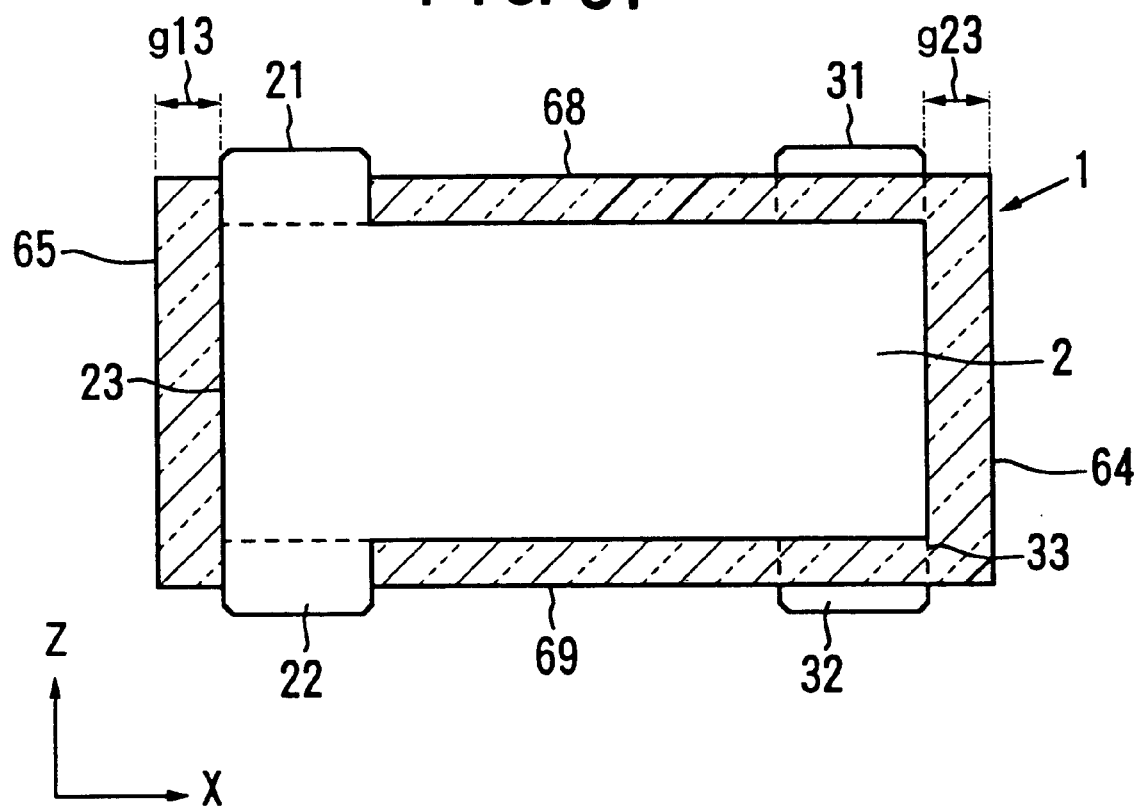
FIG. 37 is a sectional view illustrating yet another embodiment of the chip-type electronic component according to the present invention.

FIG. 37 assigns the same reference numbers to structural features identical to those illustrated in FIGS. 29 to 36. In comparison with the embodiments illustrated in FIGS. 29 to 36, the embodiment illustrated in FIGS. 37 and 38 is characterized in that the side end edge of the internal electrode film 2 (and 6, 8, 10) is positioned further inward from the side surface 64 of the ceramic substrate 1 over a gap g13 at one end in the lengthwise direction X and that a side end edge of the internal electrode film 3 (and 5, 7, 9, 11) is positioned further inward from the side surface 65 of the ceramic substrate 1 over a gap g23 at the other end in the lengthwise direction X.

Figure 38:
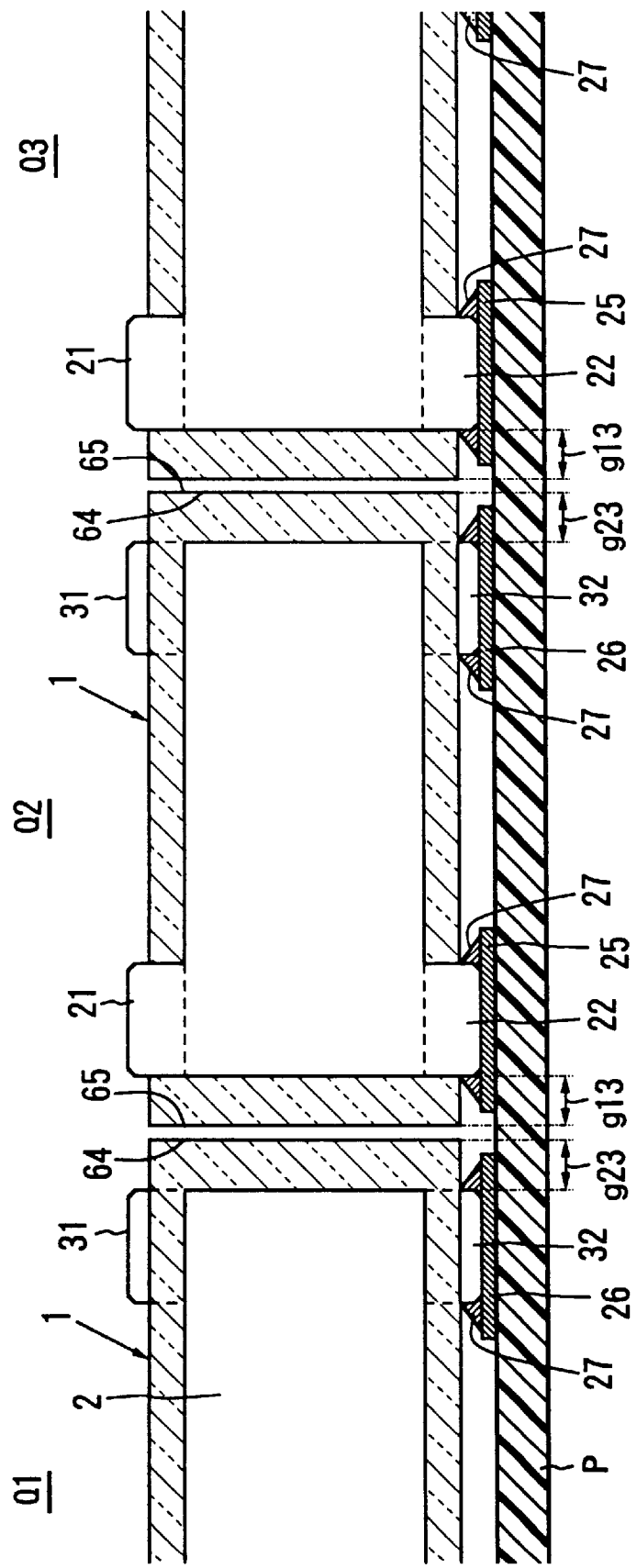
FIG. 38 illustrates a state in which the chip-type electronic component in FIG. 37 is mounted.

FIG. 38 illustrates a state in which the chip-type electronic component illustrated in FIG. 37 is mounted. The soldering portions 445 and 555 are connected and secured to the conductive patterns 25 and 26 formed on the circuit board P by the solder 27.

The side end edge of the internal electrode film 2 (and 6, 8, 10) is positioned further inward from the side surface 64 of the ceramic substrate 1 over the gap g13 at one end in the lengthwise direction X and the side end edge of the internal electrode film 3 (and 5, 7, 9, 11) is positioned further inward from the side surface 65 of the ceramic substrate 1 over the gap g23. Consequently, as illustrated in FIG. 38, a plurality of chip-type electronic components Q1 to Q3 can be sequentially mounted in the lengthwise direction X while allowing only minimum intervals between them, thereby achieving an improvement in the mounting density.

Figure 39:
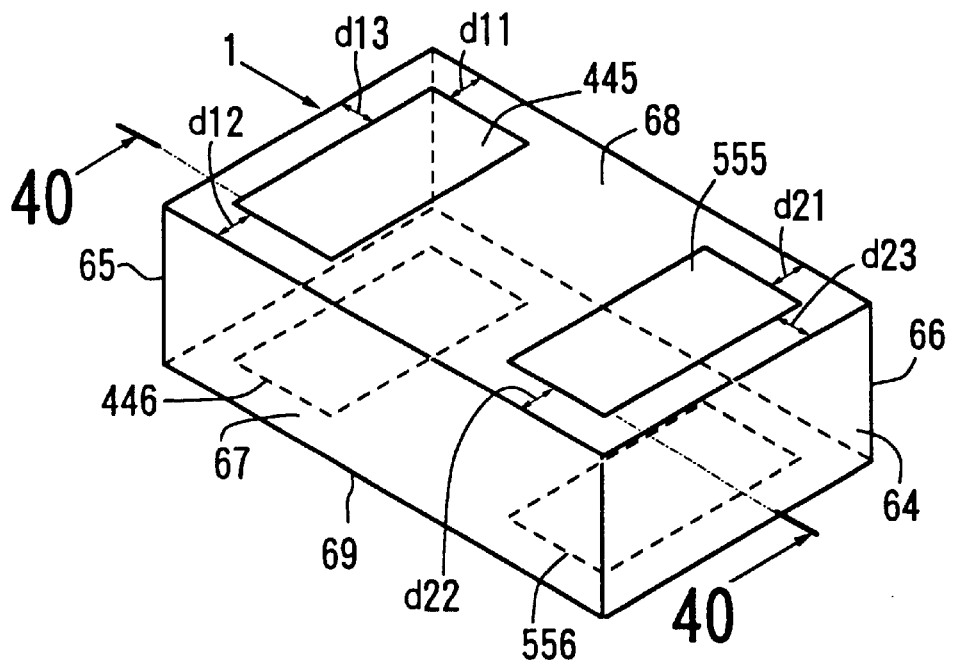
FIG. 39 is a perspective illustrating yet another embodiment of the chip-type electronic component according to the present invention.
Figure 40:
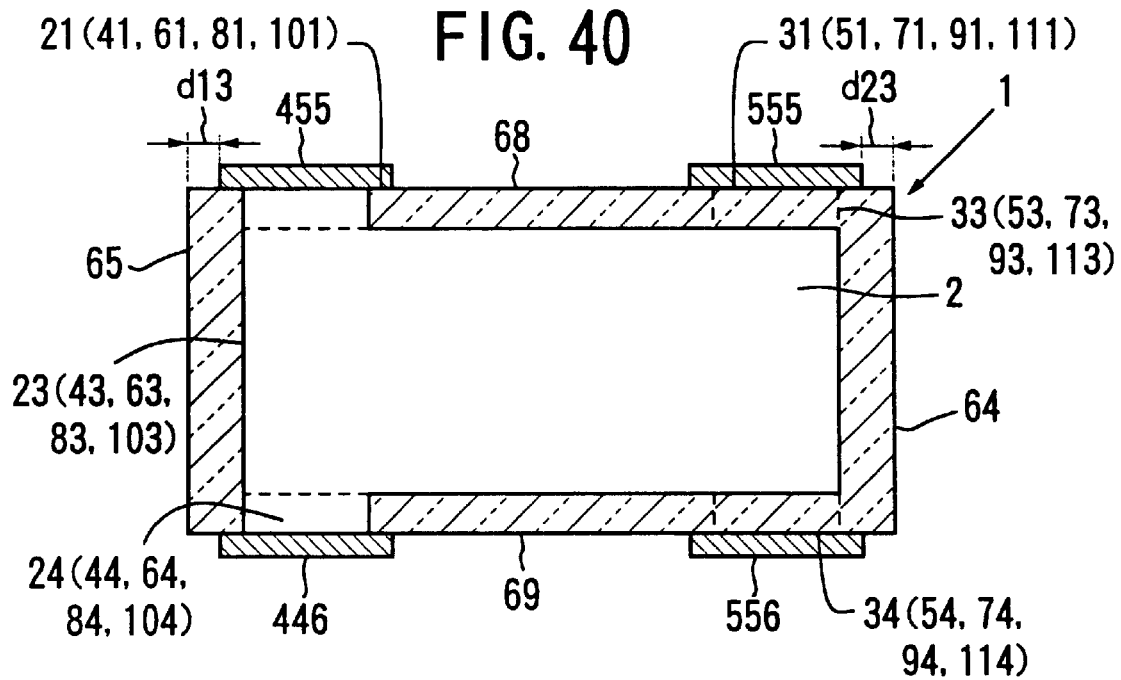
FIG. 40 is a sectional view taken along line 40—40 of FIG. 39.

Referring to FIGS. 39 and 40, in which the same reference numbers are assigned to structural features identical to those in FIGS. 37 and 38, the embodiment is characterized in that the component is provided with an external electrode 445 connected to the lead-out portion 21 (and 41, 61, 81, 101), an external electrode 446 connected to the lead-out portion 22 (and 42, 62, 82, 102), an external electrode 555 connected to the lead-out portion 31 (and 51, 71, 91, 111) and an external electrode 556 connected to the lead-out portion 32 (and 52, 72, 92, 112).

The external electrodes 445 and 446 are each formed over distances d11 to d13 from the side surfaces 64 to 67 respectively of the ceramic substrate 1, and the external electrodes 555 and 556 are each formed over distances d21 to d23 from the side surfaces 64 to 67 respectively of the ceramic substrate 1.

Figure 41:
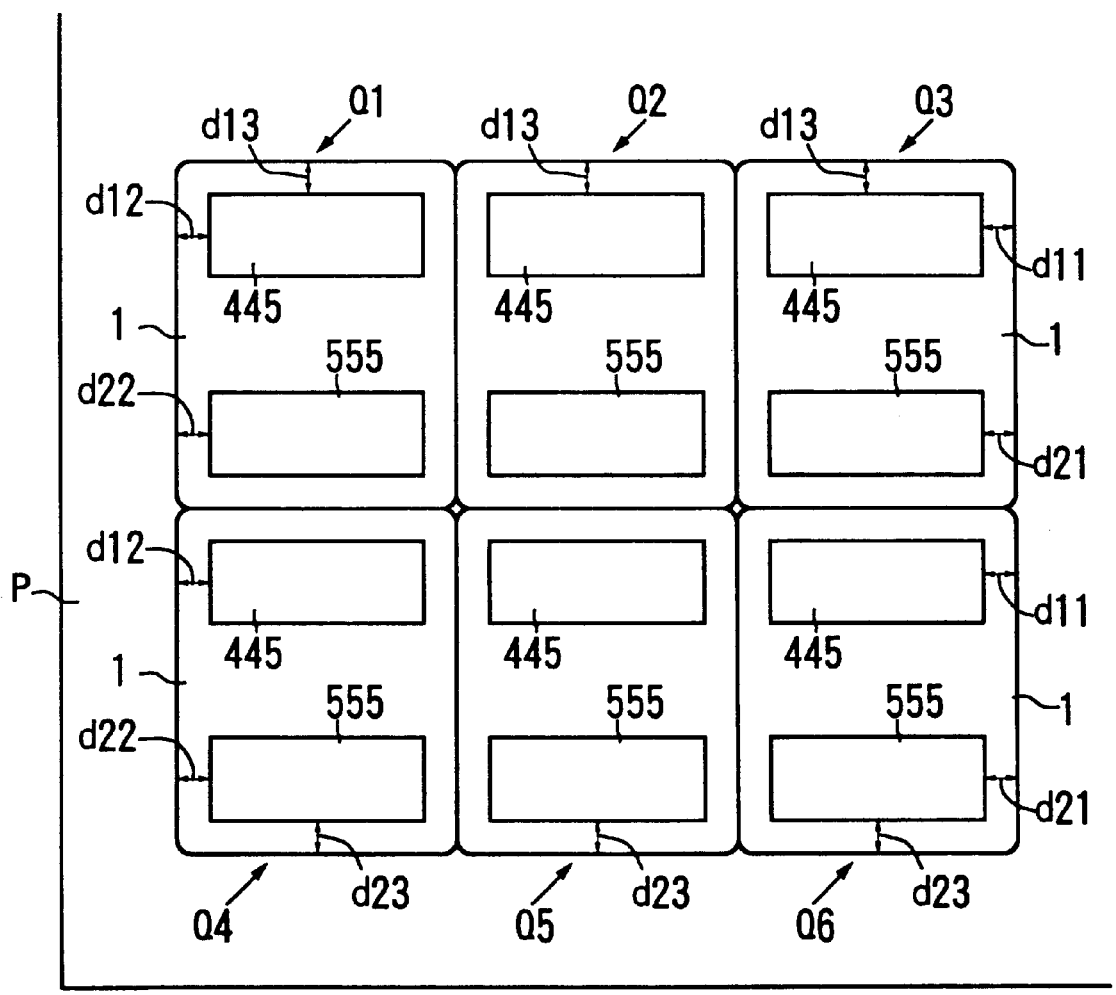
FIG. 41 illustrates a state in which the chip-type electronic component in FIGS. 39 and 40 is mounted.

FIG. 41 illustrates a state in which the chip-type electronic component illustrated in FIGS. 39 and 40 is mounted on a board. In the figure, the side on which the external electrodes 446 and 556 are provided is soldered onto the circuit board. As explained earlier, the external electrode 446 is formed over the distances d11 to d13 from the side surfaces 64 to 67 respectively of the ceramic substrate 1, and the external electrode 556 is formed over the distances d21 to d23 from the side surfaces 64 to 67 respectively of the ceramic substrate 1. As a result, a plurality of chip-type electronic components Q1 to Q6 can be mounted while allowing only minimum intervals both in the lengthwise direction and in the widthwise direction.

The chip-type electronic component described above may be secured onto the surface of the circuit board P through reflow soldering. In the reflow soldering process, first, a cream solder is printed on the conductive patterns. Next, the chip-type electronic component is placed on the surface of the circuit board P. Since the external electrodes (445, 446) and (555, 556) are provided on the upper and lower surfaces of the ceramic substrate 1 in an identical mode, the external electrodes (445, 555) or (446, 556) can be placed in contact with the cream solder for temporary retention by placing the chip-type electronic component toward the plate surface of the circuit board P either at the upper surface or the lower surface of the ceramic substrate 1. After the other chip-type electronic components are placed on the surface of the circuit board P in a similar manner, the assembly should be sent into an infrared radiation reactor to perform the soldering process by melting the cream solder.

While solder fillets are formed as the cream solder becomes molten and then solidifies during the soldering process, the solder fillets which are formed between the external electrodes (445, 555) or (446, 556) located further inward over the distances from the outer sides of the ceramic substrate 1 do not bulge out, at least, to the sides from the ceramic substrate 1. In addition, even if solder fillets gather around the thicknesswise surfaces of the external electrodes (445, 555) or (446, 556), they do not exceed the areas of the conductive patterns and, as a result, they do not bulge out to the sides from the ceramic substrate 1. Thus, a chip-type electronic component that can be mounted on a high density by effectively utilizing the limited area at the surface of the circuit board is achieved.

Next, a method for manufacturing the chip-type electronic components illustrated in FIGS. 29 to 41 is explained. First, after obtaining a green sheet constituted of a dielectric paste, a conductive paste constituted of Cu, Ag, Pd, Ni or the like is screen printed onto the sheet surface of a dielectric green sheet 200 to form internal electrode films 2. Likewise, by screen printing on the sheet surface of a dielectric green sheet 300, internal electrode films 3 are formed. A plurality of rows of the internal electrode films 2 and 3 each having, for instance, a T-shaped electrode pattern can be formed at the sheet surfaces of the dielectric green sheets 200 and 300 respectively using a common pattern by continuously placing several of them in a single row in the lateral direction at the head side of the T letter shape.

Figure 42:
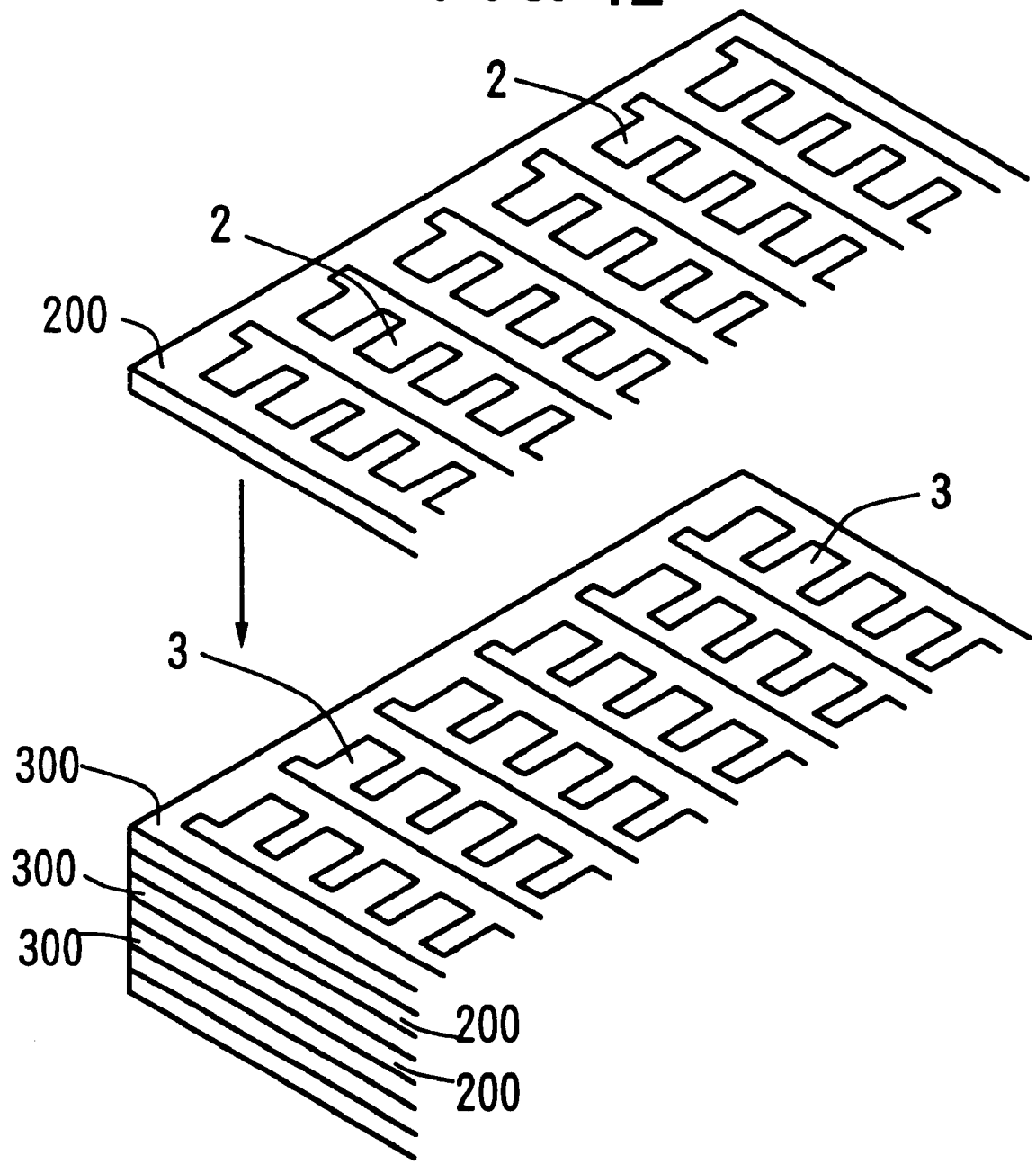
FIG. 42 illustrates a method for manufacturing the chip-type electronic components illustrated in FIGS. 29 to 40.

After forming the internal electrode films 2 and 3, dielectric green sheets 200 and 300 are laminated alternately with each other over a plurality of layers as illustrated in FIG. 42. This lamination process should be implemented by ensuring that the internal electrode films 2 formed at the dielectric green sheets 200 and the internal electrode films 3 formed at the dielectric green sheets 300 achieve reverse electrode patterns from each other. Then, through press molding performed on a specific number of a plurality of layers sequentially laminated on top of one another, a laminated body that yields a plurality of components is formed. Although not shown, a protective layer constituted of a dielectric material is laminated onto the outermost layer of the laminated body.

Figure 43:
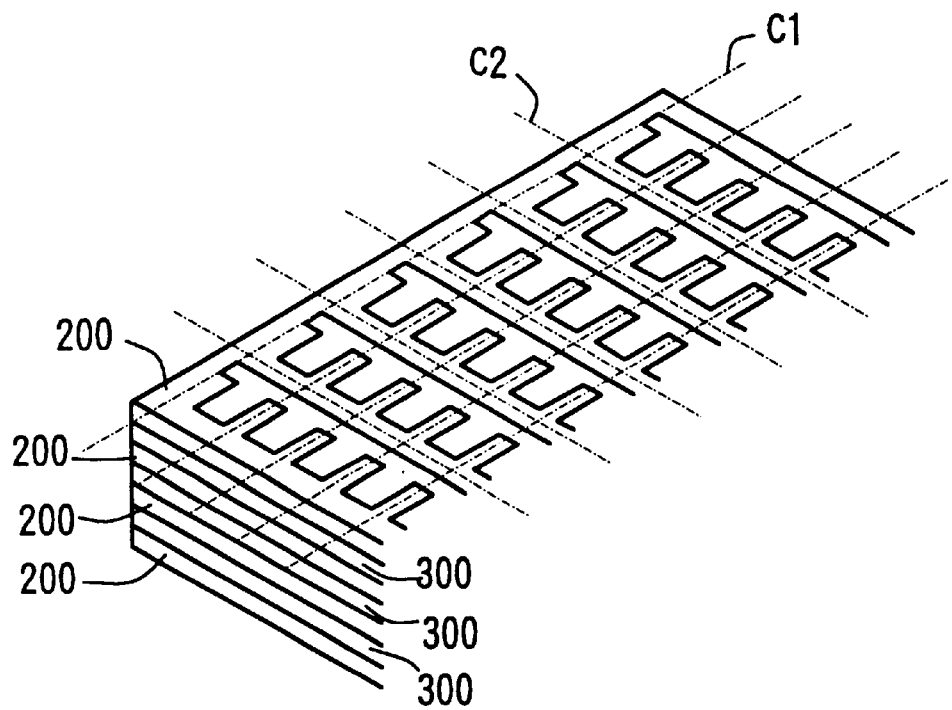
FIG. 43 illustrates a step following the step shown in FIG. 42.
Figure 44:
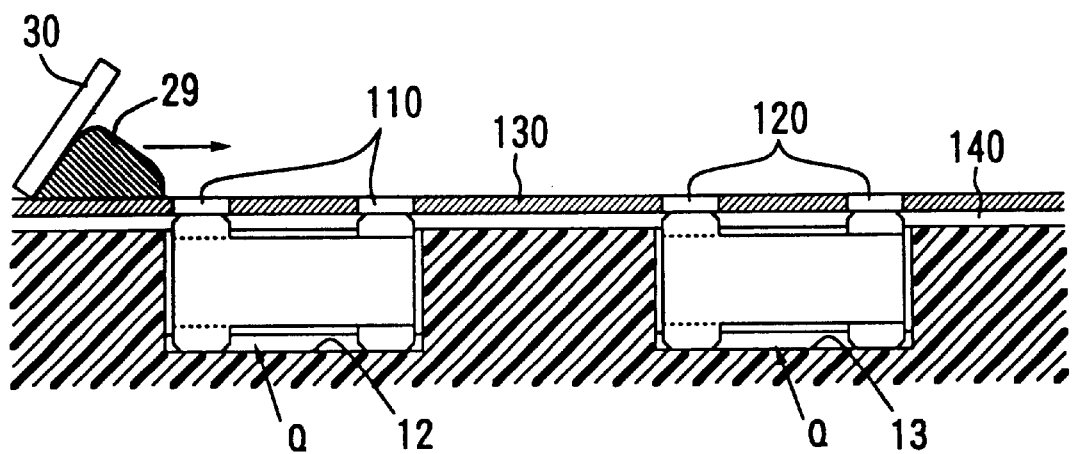
FIG. 44 illustrates a step following the step shown in FIG. 43.

The laminated body is then cut to yield individual components in units of component element assemblies, as illustrated in FIG. 43. This cutting process is implemented along the direction C1 to cut into the individual head sides of the T shapes and along the direction C2 to cut into individual T shapes that are formed over a plurality of rows, in the case of the electrode patterns constituted of the head sides of the T shapes lying continuous to one another in the lateral direction described above. Through this process, component elements, each having portions of the end surfaces of the internal electrode films 2 and 3 that are not electrically continuous with each other exposed within the planes of the upper and lower surfaces toward the two ends are achieved. In addition, the cutting process, which is implemented while the laminated body is in an unbaked, raw state, can be performed easily using a normal, linear blade slicer.

After the laminated body is cut into individual component elements, a grinding finish is implemented to expose portions of the lead-out portions of the internal electrode films. After this, the individual component elements are sent into a baking oven to undergo a baking process.

Through the baking process, which is performed at a temperature within the range of approximately 1000° C. to 1400° C., the dielectric layers are sintered into an integrated unit. Thus, the electronic component elements Q each having portions of the end surfaces of the internal electrode films 2 and 3 that are not electrically continuous with each other exposed within the planes of the upper and lower surfaces toward the two ends, are achieved.

A conductive paste constituted of Ag, Cu or the like is applied to each electronic component element Q that has undergone the baking process to form external electrodes. This electrode formation may be achieved through a printing process performed on the two surfaces of each electronic component element Q by employing a palette-shaped jig 140 that houses a plurality of electronic component elements Q in its indented portions 12 and 13 to hold them in alignment, a metal mask 130 having hole portions 110 and 120 that correspond to the positions of the individual ends of the internal electrode films exposed at the ground surfaces of the electronic component elements Q and a squeegee that moves the conductive paste 29 and by reversing the electronic component elements Q with the jig 140.

Through this printing process, a plurality of component main bodies that are held in alignment by the jig 140 can be processed in a batch. In addition, the conductive paste 29 can be applied to the ground surfaces of the electronic component elements Q with a high degree of accuracy.

A baking process is implemented on the conductive paste 29 thus printed at a temperature within the range of approximately 500° C. to 900° C., and by plating it with Ni, Sn, solder or the like, it can be formed into external electrodes. Since the external electrodes are heated only at a temperature required for baking the conductive paste G, the external electrodes that are electrically connected with the portions of the lead-out portions of the internal electrode films can be formed in the same mode within the planes of the upper and lower surfaces of the component main body while maintaining distances from the external circumferential edges of the electronic component element Q, without resulting in any degradation of the electrical characteristics and conduction defects related to the internal electrode films.

Figure 45:
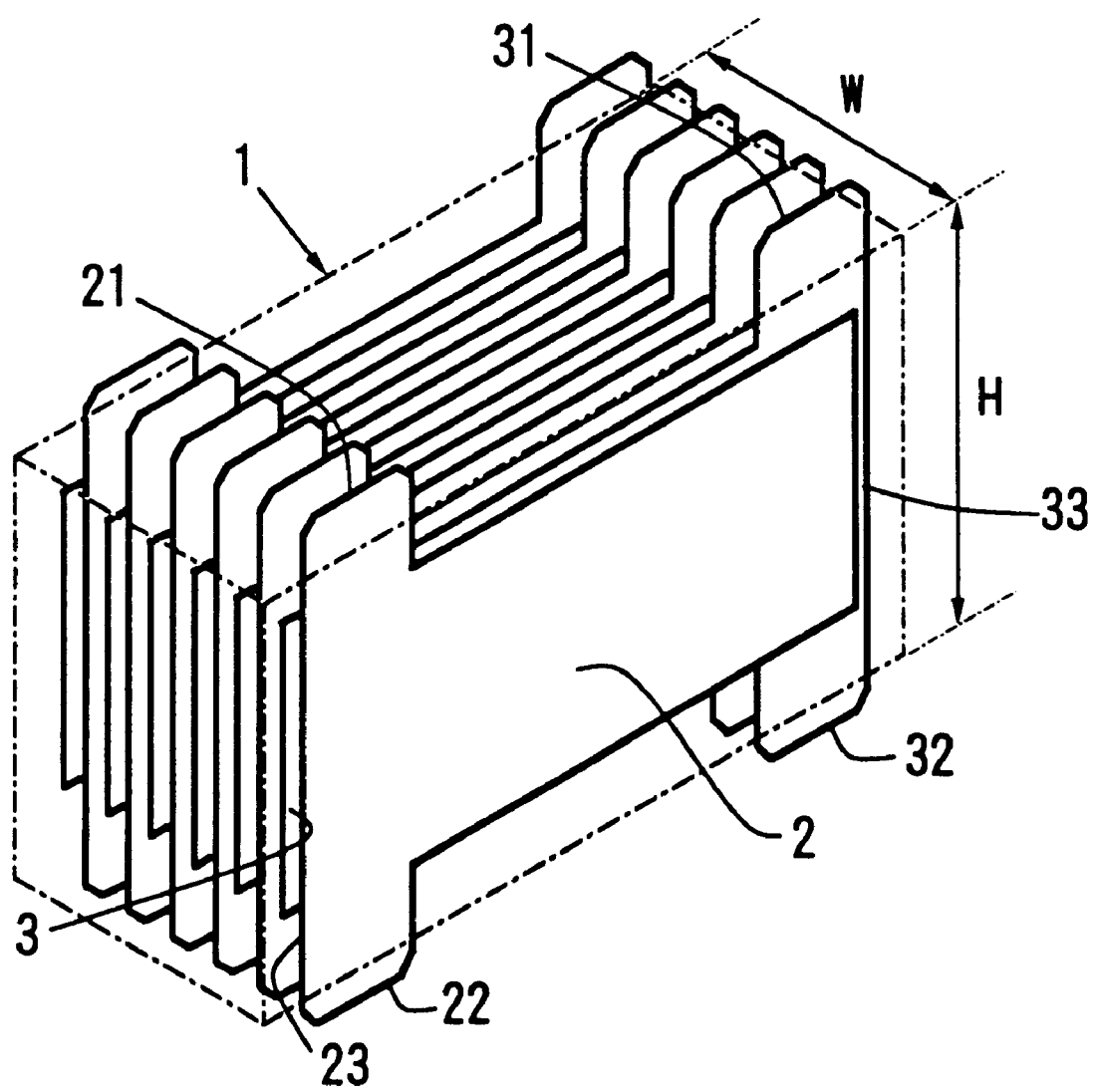
FIG. 45 is a perspective illustrating yet another embodiment of the chip-type electronic component according to the present invention.

By adopting the structure of the chip-type electronic component and the manufacturing method thereof described above, a chip-type electronic component having a small width W relative to the height H of the component main body, as illustrated in FIG. 45, is obtained. Since this chip-type electronic component achieves miniaturization of the component, it is ideal for high density mounting.

What is claimed is:

1. A method for manufacturing a chip-type electronic component having a plurality of internal electrode films and ceramic layers alternately laminated with each other, a lead-out portion of one of every two adjacent internal electrode films being exposed at one of two diametrical ends in a lengthwise direction, a lead-out portion of the other internal electrode film of said every two adjacent internal electrode films being exposed at the other of two diametrical ends in said lengthwise direction, and external electrodes being electrically connected with said lead-out portions of said internal electrode films, said method comprising the steps of:

forming a ceramic laminated substrate containing a plurality of electronic component elements;

printing a conductive paste along cutting lines on said ceramic laminated substrate corresponding to lead-out portions at which said internal electrode films are exposed, with said conductive paste printed in a strip over both sides of said cutting lines on a surface of an outermost layer;

drying the printed conductive paste;

cutting said ceramic laminated substrate along said dried conductive paste printed in the strip over both sides of the cutting lines to take out said electronic component elements such that each of said electronic components includes soldering portions corresponding to portions of the dried printed conductive paste; and pressing diametrical end surfaces of said ceramic laminated substrate at which said internal electrode films are exposed in each of said electronic component elements thus taken out against a thin film constituted of conductive paste to form a transfer film constituted of said conductive paste, wherein the printing step is performed prior to any cutting step.

2. A method for manufacturing a chip-type electronic component, comprising the steps of:

producing a laminated substrate containing a plurality of electronic component elements by alternately laminating a plurality of internal electrode films and a plurality of dielectric green sheets;

taking out said electronic component elements separately by cutting said laminated substrate;

performing a baking process on each of said electronic component elements thus taken out;

exposing lead-out portions of internal electrode films that are not electrically connected with each other in each of said electronic component elements within individual planes over distances toward two ends of a component main body parallel to said end surfaces; and forming external electrodes that are to be electrically connected with lead-out portions of said internal electrode films within the planes of an upper surface and a lower surface of each of said electronic component elements in an identical mode while maintaining distances from outer circumferential edges of each of said electronic component elements, wherein the distances from the outer circumferential edges of each of the electronic component elements are equal to each other and are equal to or greater than 10 μm.

3. The method for manufacturing a chip-type electronic component of claim 2, further comprising the steps of:

performing a baking process after grinding individual surfaces of each component element assembly in which individual ends of said internal electrode films are exposed; and forming said external electrodes at individual surfaces of said component main body that have been ground.

4. The manufacturing method of claim 2, further comprising the steps of:

holding a plurality of component main bodies that have been baked in alignment using a jig;

applying a conductive paste to upper and lower surfaces of said component main bodies; and forming external electrodes through a baking process performed on said conductive paste.

5. A method for surface mounting a chip-type electronic component on a circuit board, with said chip-type electronic component including a ceramic substrate having two side surfaces in a lengthwise direction and two side surfaces in a widthwise direction intersecting each other, and first and second flat surfaces in a thicknesswise direction, said second flat surface facing opposite the first flat surface and at least one internal electrode film embedded in said ceramic substrate with a film surface intersecting said first and second flat surfaces of said ceramic substrate roughly orthogonally and three lead-out portions exposed to an outside of said ceramic substrate, and in which two lateral sides of the at least one internal electrode film form a main portion of the at least one internal electrode film and are located further inward from the first and second flat surfaces in the thicknesswise direction over first and second gaps, respectively, and said three lead-out portions are an end portion of the at least one internal electrode film and are respectively exposed at said first and second flat surfaces and one of the two side surfaces in the lengthwise direction so as to serve as a three-dimensionally arrayed external electrode exposed to the outside of the ceramic substrate, said method comprising the steps of:

mounting said chip-type electronic component on said circuit board in a direction in which film surfaces of internal electrode films of said chip-type electronic component extend orthogonally relative to a mounting surface of said circuit board; and soldering external electrodes of said chip-type electronic component to conductive patterns formed on said circuit board.

* * * * *

UNITED STATES PATENT AND TRADEMARK OFFICE
CERTIFICATE OF CORRECTION

PATENT NO.    : 6,576,497 B2
DATED         : June 10, 2003
INVENTOR(S)   : Ahiko et al.

It is certified that error appears in the above-identified patent and that said Letters Patent is hereby corrected as shown below:

Title page,
Item [30], Foreign Application Priority Data, should read:
-- [30]      Foreign Application Priority Data
        Mar. 31, 1998   (JP) ........................... 10-104075
        Apr. 21, 1998   (JP) ........................... 10-111044
        Oct. 28, 1998   (JP) ........................... 10-307593 --

Signed and Sealed this

Eleventh Day of November, 2003

JAMES E. ROGAN
*Director of the United States Patent and Trademark Office*